US012581966B2

(12) United States Patent
We et al.

(10) Patent No.: US 12,581,966 B2
(45) Date of Patent: Mar. 17, 2026

(54) ELECTRONIC COMPONENT PLACED ON CORE OF SUBSTRATE

(71) Applicant: QUALCOMM Incorporated, San Diego, CA (US)

(72) Inventors: Hong Bok We, San Diego, CA (US); Joan Rey Villarba Buot, Escondido, CA (US); Michelle Yejin Kim, Carlsbad, CA (US); Kuiwon Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 341 days.

(21) Appl. No.: 18/310,388

(22) Filed: May 1, 2023

(65) Prior Publication Data

US 2024/0371775 A1 Nov. 7, 2024

(51) Int. Cl.
| | |
|---|---|
| H01L 23/538 | (2006.01) |
| H01L 21/48 | (2006.01) |
| H01L 23/00 | (2006.01) |
| H01L 23/498 | (2006.01) |

(52) U.S. Cl.
CPC ...... H01L 23/5383 (2013.01); H01L 21/4857 (2013.01); H01L 23/49816 (2013.01); H01L 23/5386 (2013.01); H01L 24/29 (2013.01); H01L 24/32 (2013.01); H01L 24/83 (2013.01); H01L 2224/2919 (2013.01); H01L 2224/32225 (2013.01); H01L 2224/8385 (2013.01)

(58) Field of Classification Search
CPC ........... H01L 23/49822; H01L 23/5383; H01L 23/49816; H01L 23/5386; H01L 23/145; H01L 23/49827; H01L 23/5389; H01L 24/29; H01L 24/32; H01L 24/83; H01L 2224/2919; H01L 2224/32225; H01L 2224/8385; H01L 21/4857; H05K 1/185
See application file for complete search history.

(56) References Cited

U.S. PATENT DOCUMENTS

| | | | | |
|---|---|---|---|---|
| 2006/0003495 | A1* | 1/2006 | Sunohara | H01L 23/50 |
| | | | | 257/E23.079 |
| 2009/0057913 | A1* | 3/2009 | Hsu | H01L 23/5389 |
| | | | | 257/E23.141 |
| 2016/0118333 | A1* | 4/2016 | Lin | H01L 22/20 |
| | | | | 257/773 |
| 2019/0267327 | A1* | 8/2019 | Aoki | H01L 23/5389 |
| 2020/0163223 | A1* | 5/2020 | Mok | H05K 1/185 |
| 2020/0266149 | A1* | 8/2020 | Xu | H01L 21/4857 |

(Continued)

OTHER PUBLICATIONS

International Search Report and Written Opinion—PCT/US2024/024965—ISA/EPO—Aug. 13, 2024.

*Primary Examiner* — Moazzam Hossain
(74) *Attorney, Agent, or Firm* — Muncy, Geissler, Olds & Lowe, P.C.

(57) ABSTRACT

In an aspect, a substrate includes a core that includes a core dielectric and a first conductive pattern on a first surface of the core dielectric, and a first metallization structure over the first surface of the core dielectric. The first metallization structure includes a first dielectric, and the first dielectric has a first opening formed therein. The substrate further includes a first electronic component disposed in the first opening of the first dielectric, and a first adhesive layer coupling the first electronic component with the core.

27 Claims, 18 Drawing Sheets

(56) References Cited

U.S. PATENT DOCUMENTS

| | | | |
|---|---|---|---|
| 2022/0230972 A1* | 7/2022 | Raorane | ................. H01L 24/19 |
| 2023/0268310 A1* | 8/2023 | Itakura | .................... H01L 24/73 |
| | | | 257/723 |
| 2025/0070037 A1* | 2/2025 | Otsubo | .............. H01L 23/5386 |

* cited by examiner

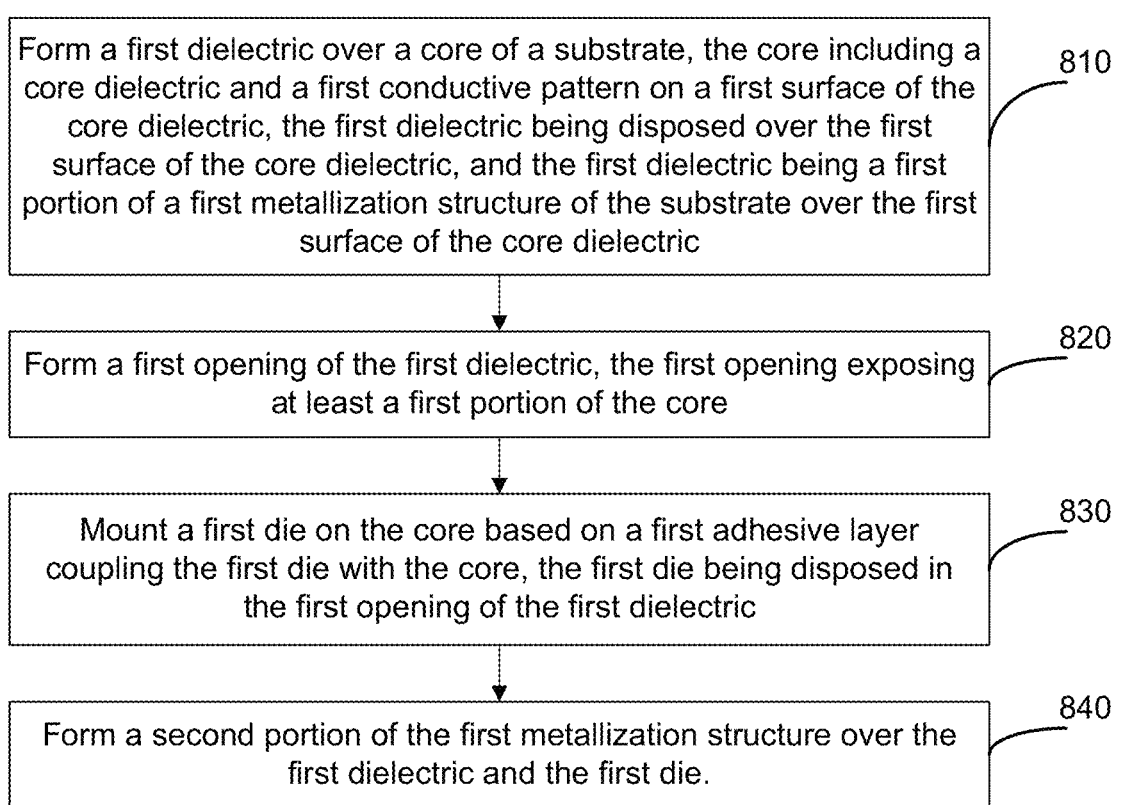

Form a first dielectric over a core of a substrate, the core including a core dielectric and a first conductive pattern on a first surface of the core dielectric, the first dielectric being disposed over the first surface of the core dielectric, and the first dielectric being a first portion of a first metallization structure of the substrate over the first surface of the core dielectric — 810

Form a first opening of the first dielectric, the first opening exposing at least a first portion of the core — 820

Mount a first die on the core based on a first adhesive layer coupling the first die with the core, the first die being disposed in the first opening of the first dielectric — 830

Form a second portion of the first metallization structure over the first dielectric and the first die. — 840

PROVIDE SUBSTRATE COMPRISING AT LEAST A PLURALITY OF INTERCONNECTS — 1005

COUPLE INTEGRATED DEVICE(S) AND/OR INTEGRATED PASSIVE DEVICE(S) TO A FIRST SURFACE OF
THE SUBSTRATE, WHERE AN INTEGRATED DEVICE AND/OR AN INTEGRATED PASSIVE DEVICE INCLUDES A MOISTURE SENSIOR — 1010

COUPLE SOLDER INTERCONNECTS TO THE SUBSTRATE — 1015

ELECTRONIC COMPONENT PLACED ON CORE OF SUBSTRATE

FIELD OF DISCLOSURE

The present disclosure generally relates to a substrate, and more particularly, to an electronic component placed on a core of a substrate.

BACKGROUND

Integrated circuit (IC) technology has achieved great strides in advancing computing power through miniaturization of electrical components. An IC may be implemented in the form of an IC chip that has a set of circuits integrated thereon. In some implementations, one or more IC chips can be physically carried and protected by an IC package, where various power and signal nodes of the one or more IC chips can be electrically coupled to respective conductive terminals of the IC package via electrical paths formed in a package substrate of the IC package. Various packaging technologies can be found in many electronic devices, including processors, servers, radio frequency (RF) integrated circuits, etc. Advanced packaging and processing techniques can be used to implement complex devices, such as multi-electronic component devices and system on a chip (SOC) devices, which may include multiple function blocks, with each function block designed to perform a specific function, such as, for example, a microprocessor function, a graphics processing unit (GPU) function, a communications function (e.g., Wi-Fi, Bluetooth, and other communications), and the like.

In some implementations, embedded electronic components, such as deep trench capacitors, have been incorporated in IC packaging for performance improvement and package size reduction. One factor driving the use of such embedded electronic components is the desire for obtaining small form factor products with equivalent or better electrical performance than their larger electronic components counterparts. Depending on the size and/or thickness of the package substrate and the size and/or the process node of the IC Chip carried thereon, the process for embedding a passive device in a package substrate in one packaging task may not be suitable for another packaging task.

Accordingly, there is a need for improved methods for embedding an electronic component in a substrate, such as a package substrate, that may be suitable for a broader variety of packaging tasks.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a substrate includes a core that includes a core dielectric and a first conductive pattern on a first surface of the core dielectric; a first metallization structure over the first surface of the core dielectric, the first metallization structure including a first dielectric, and the first dielectric having a first opening formed therein; a first electronic component disposed in the first opening of the first dielectric; and a first adhesive layer coupling the first electronic component with the core.

In an aspect, a method of manufacturing a substrate includes forming a first dielectric over a core of the substrate, the core including a core dielectric and a first conductive pattern on a first surface of the core dielectric, the first dielectric being disposed over the first surface of the core dielectric, and the first dielectric being a first portion of a first metallization structure of the substrate over the first surface of the core dielectric; forming a first opening of the first dielectric, the first opening exposing at least a first portion of the core; mounting a first electronic component on the core based on a first adhesive layer coupling the first electronic component with the core, the first electronic component being disposed in the first opening of the first dielectric; and forming a second portion of the first metallization structure over the first dielectric and the first electronic component.

In an aspect, an electronic device includes a substrate that includes: a core that includes a core dielectric and a first conductive pattern on a first surface of the core dielectric; a first metallization structure over the first surface of the core dielectric, the first metallization structure including a first dielectric, and the first dielectric having a first opening formed therein; a first electronic component disposed in the first opening of the first dielectric; and a first adhesive layer coupling the first electronic component with the core.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIG. 8 illustrates a method for manufacturing a substrate, according to aspects of the disclosure.

Figure 1:
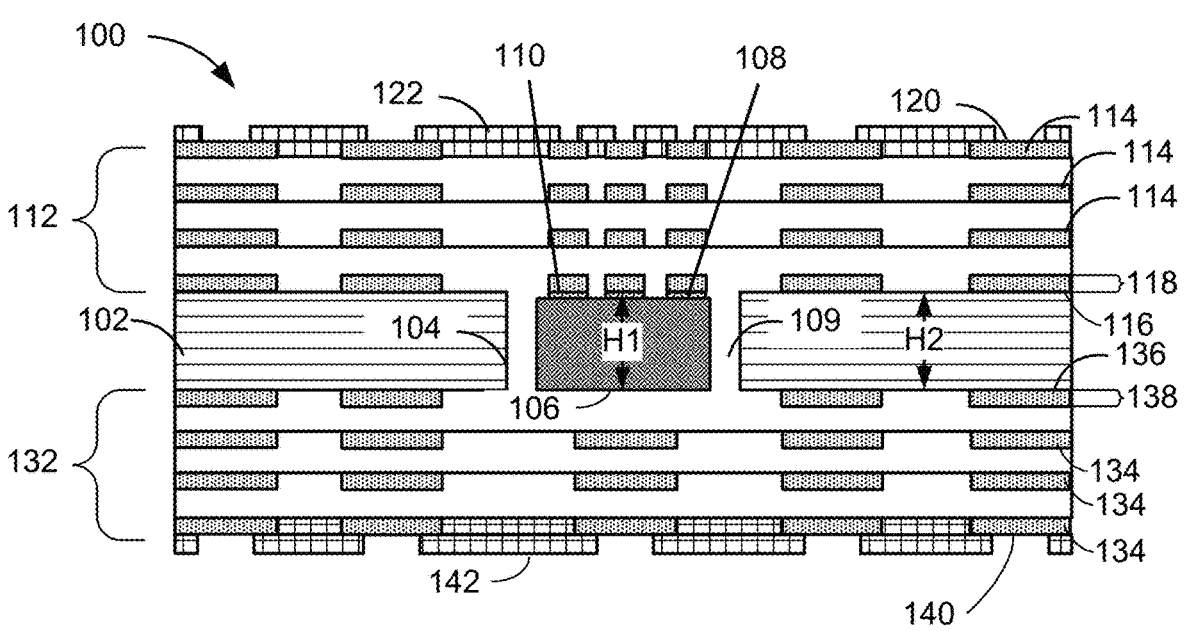
FIG. 1 is a cross-sectional view of a first example substrate with an embedded electronic component, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

FIG. 1 is a cross-sectional view of a first example substrate 100 with an embedded electronic component, according to aspects of the disclosure. In this example, the substrate 100 includes a core 102 having a cavity 104 that extends entirely through the core 102. An electronic component 106 is disposed within the cavity 104. The electronic component 106 has an upper surface 108 with metal terminals 110 that provide an electrical connection to a device (e.g., capacitor) configured in the electronic component 106.

In accordance with various aspects of this disclosure, the substrates described herein (e.g., substrate 100) that include a core and an embedded electronic component are directed to package substrates. A package substrate is the part of an integrated circuit package that gives the package its mechanical strength and allows the circuitry of the integrated circuit to be electrically coupled with external devices. Such package substrates are to be distinguished from other substrates, such as the substrates that may be included in the embedded electronic component itself, or dies including substrates (e.g., silicon substrates or other similar electronic devices).

The substrate 100 further includes a plurality of dielectric layers 112 and corresponding patterned metallization layers 114 overlying an upper surface 116 of the core 102. A patterned metallization layer 118 is disposed at the upper surface 116 of the core 102 to provide an electrical connection between the metal terminals 110 of the electronic component 106 and the patterned metallization layers 114. In an aspect, the same dielectric resin material as used in forming the plurality of dielectric layers 112 may be used in the interstitial regions 109 of the cavity 104 between the sidewalls of the electronic component 106 and the sidewalls of the cavity 104. Dispensing a dielectric resin over the electronic component 106 and in the interstitial regions 109 assists in securing the electronic component 106 within the cavity 104 so that the metal terminals 110 remain in electrical contact with corresponding portions of the patterned metallization layer 118 once the dielectric resin is cured.

In an aspect, an uppermost patterned metallization layer 114 at an upper surface 120 of the substrate 100 is connected to a plurality of metal terminals 122. The patterned metallization layers 114 provide a conductive path between the metal terminals 110 of the electronic component 106 and the metal terminals 122. In an aspect, the plurality of metal terminals 122 may be configured for connection to an electronic package of a surface-mounted device (not shown in FIG. 1).

In an aspect, a further plurality of dielectric layers 132 and corresponding patterned metallization layers 134 overlie a lower surface 136 of the core 102. Here, a patterned metallization layer 138 is disposed over the lower surface 136 of the core 102. A lowermost patterned metallization layer 134 at a lower surface 140 of the substrate 100 is connected to a plurality of metal terminals 142. The patterned metallization layers 134 provide a conductive path to the metal terminals 142. In an aspect, the plurality of metal terminals 142 may be configured for connection to an electronic package of a further surface mounted device (not shown in FIG. 1) or to a circuit board for connection with other devices.

In FIG. 1, the electronic component 106 has a height H1 that is substantially the same as the thickness H2 of the core 102. During manufacture of the substrate 100, the electronic component 106 is inserted in the cavity 104 before a dielectric resin is injected to fill the interstitial regions 109 between the cavity 104 and electronic component 106. During insertion, the electronic component 106 is carefully aligned within the cavity 104 to ensure that the metal terminals 110 properly contact and electrically bond with the corresponding portions of the patterned metallization layer 118. Additionally, the injection of the dielectric resin in the interstitial regions 109 should be undertaken with care so as not to disturb the initial alignment of the electronic component 106. In an aspect, the dielectric resin, once cured, secures the electronic component 106 at its proper location within the cavity 104.

In scenarios in which the height H1 of the electronic component 106 and thickness H2 of the core 102 are substantially the same, the insertion of the electronic component 106 in the cavity 104 and subsequent injection and cure of the dielectric resin may be implemented using the processing technology as described with reference to FIG. 1. In an example, the height H1 of the electronic component and the thickness H2 of the core 102 in FIG. 1 may each be equal to or less than about 760 micrometers.

Although the structure of the substrate 100 shown in FIG. 1 has been suitable for use in many high performance applications (e.g., compute and automotive applications), current trends are directed to applications requiring substrates having larger body sizes. However, substrates having large bodies present unique design and manufacturing issues that must be addressed (e.g., substrate warpage, a need for larger cavity sizes, a need for larger keepout zones, etc.). These issues may be addressed, at least in part, by employing thick cores in the design and manufacture of such substrates. For example, warpage control is more easily achieved with thick cores than with thin cores. Additionally, the need for larger cavity sizes and keep out zones can be met by employing such thick cores.

However, substrates employing thick cores may be difficult to manufacture using the same packaging technologies that are used in manufacturing substrates having thin cores of the type described in connection with FIG. 1. With thick cores, there is a significant gap between the electronic component and the cavity resulting from the increased depth of the cavity compared to the height of the electronic component (e.g., the thick core has a thickness that is greater than the height of the electronic component). In such thick core scenarios, it may be difficult or impossible to fill the gap surrounding the electronic component with the dielectric resin in a manner that maintains the proper initial alignment of the electronic component in the cavity during the resin injection. Further, it may be difficult or impossible to inject a sufficient amount of dielectric resin in the gap to secure the electronic component at its desired position once the dielectric resin is secured.

Figure 2:
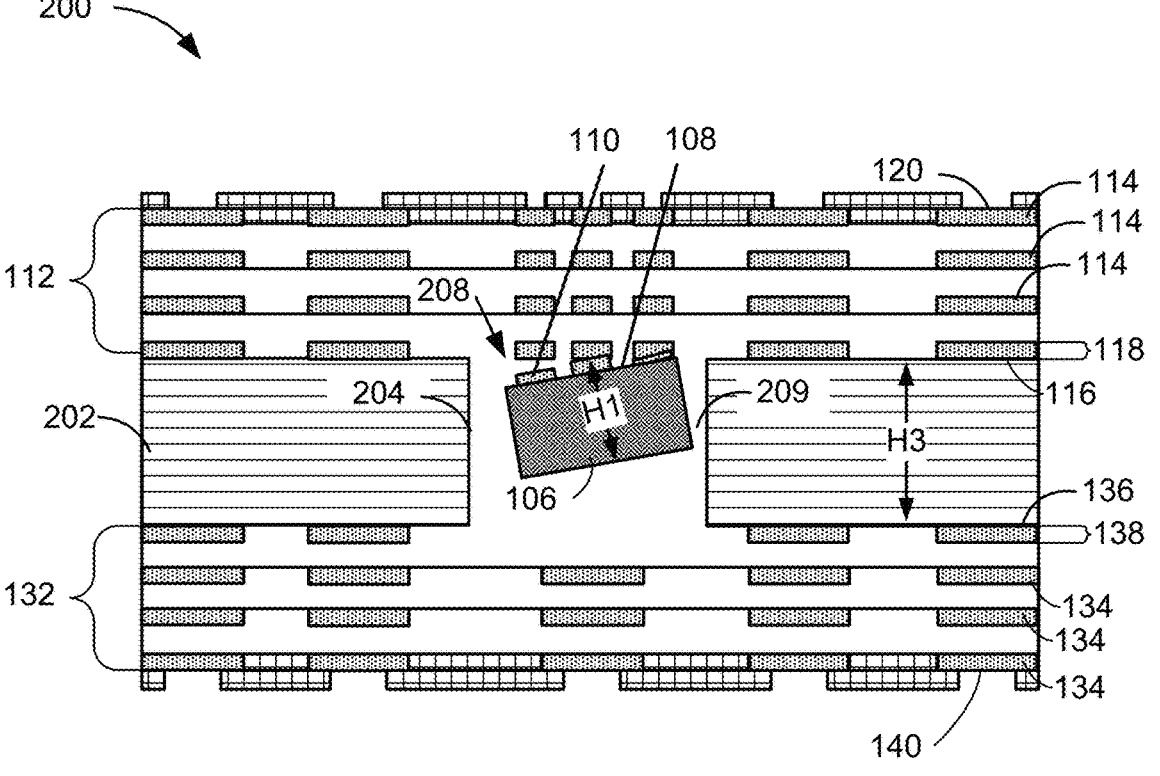
FIG. 2 is a cross-sectional view of a second example substrate with an embedded electronic component, according to aspects of the disclosure.

FIG. 2 is a cross-sectional view of a second example substrate 200 with an embedded electronic component, according to aspects of the disclosure. In this example, it is assumed that the substrate 200 has been manufactured using the same processing operations as used to manufacture the substrate 100 shown in FIG. 1. For purposes of simplicity, certain reference numbers used in FIG. 1 have also been used to designate similar elements in FIG. 2.

In the example shown in FIG. 2, the substrate 200 differs from the substrate 100 of FIG. 1 in that the substrate 200 employs a thick core 202 having a thickness H3 that is greater than the height H1 of the electronic component 106. In accordance with certain aspects of the disclosure, the thickness H3 is greater than about 760 micrometers and, as such, is thicker than the electronic component 106 and its thin core 102 counterpart. In certain scenarios, the thick core may have a thickness that is substantially greater than 760 micrometers (e.g., 820 micrometers, 1240 micrometers, etc.).

The substrate 200 has a cavity 204 that is substantially deeper than the cavity 104 of the substrate 100. As such, it becomes more difficult to align the metal terminals 110 with the corresponding portions of the patterned metallization layer 118 during the initial placement of the electronic component 106 within the cavity 204. Initial misalignment of the electronic component 106 may fail to establish an electrical connection between the metal terminals 110 and corresponding portions of the patterned metallization layer 118. Additionally, it becomes challenging to correctly fill the cavity 209 (e.g., particularly including the extended interstitial regions of the cavity 209) with an amount of dielectric resin that, once cured, properly surrounds and secures the electronic component 106 in place within the cavity 204. An insufficient fill of the cavity 204 with the dielectric resin can lead to subsequent delamination of the electronic component 106 from electrical contact with the corresponding portions of the patterned metallization layer 118 once the substrate 200 is incorporated in a more extensive electronic system (e.g., automobile sensors/computers, mobile devices, or any other type of electronic device as described herein). In FIG. 2, an instance of delamination is shown at region 208, where some of the metal terminals 110 have pulled away from the corresponding portions of the patterned metallization layer 118.

Figure 3:
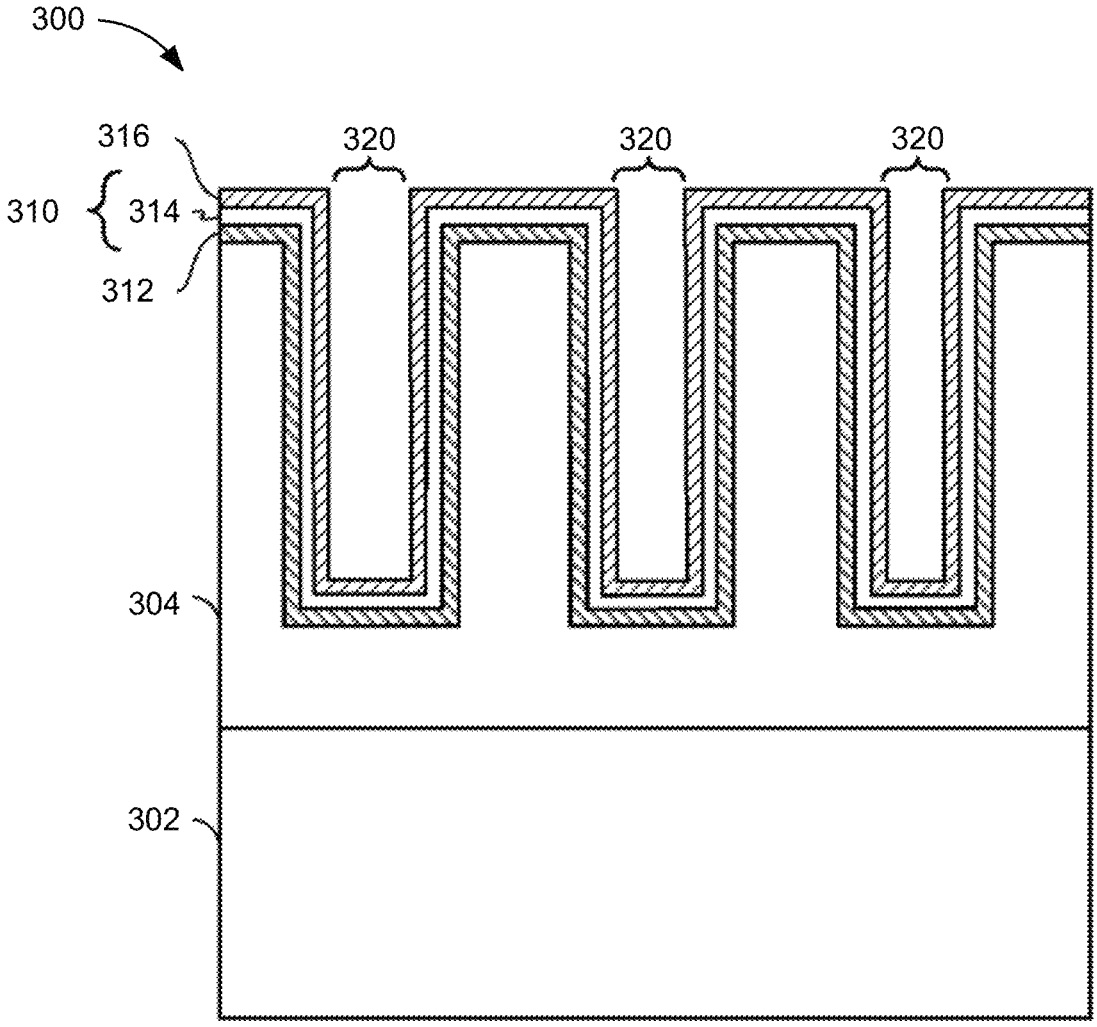
FIG. 3 is a cross-sectional view of an example deep trench capacitor, according to aspects of the disclosure.

According to certain aspects of the disclosure, the electronic component may be a deep trench capacitor (DTC). FIG. 3 is a cross-sectional view of an example DTC 300, according to aspects of the disclosure. In FIG. 3, a capacitor 310 is deposited in trenches 320 of an insulator 304 on a substrate 302. The capacitor 310 may include a metal layer 312, a dielectric layer 314, and a metal layer 316. The dielectric layer 314 separates the metal layer 312 from the metal layer 316. The metal layers 312, 316 form electrodes of the capacitor 310 and may be connected to terminals at, for example, a surface (see, e.g., the upper surface 108 with metal terminals 110 of electronic component 106 shown in FIG. 1). In some scenarios, the capacitors are formed from an array of deep trenches in a substrate and filled with an electrical insulator (e.g., a dielectric) between layers of electrodes. In some scenarios, the capacitors are attached on the land side under in integrated circuit die shadow (land-side capacitor: LSC) or adjacent to the die on the die side (die-side capacitor: DSC).

Figure 4A:
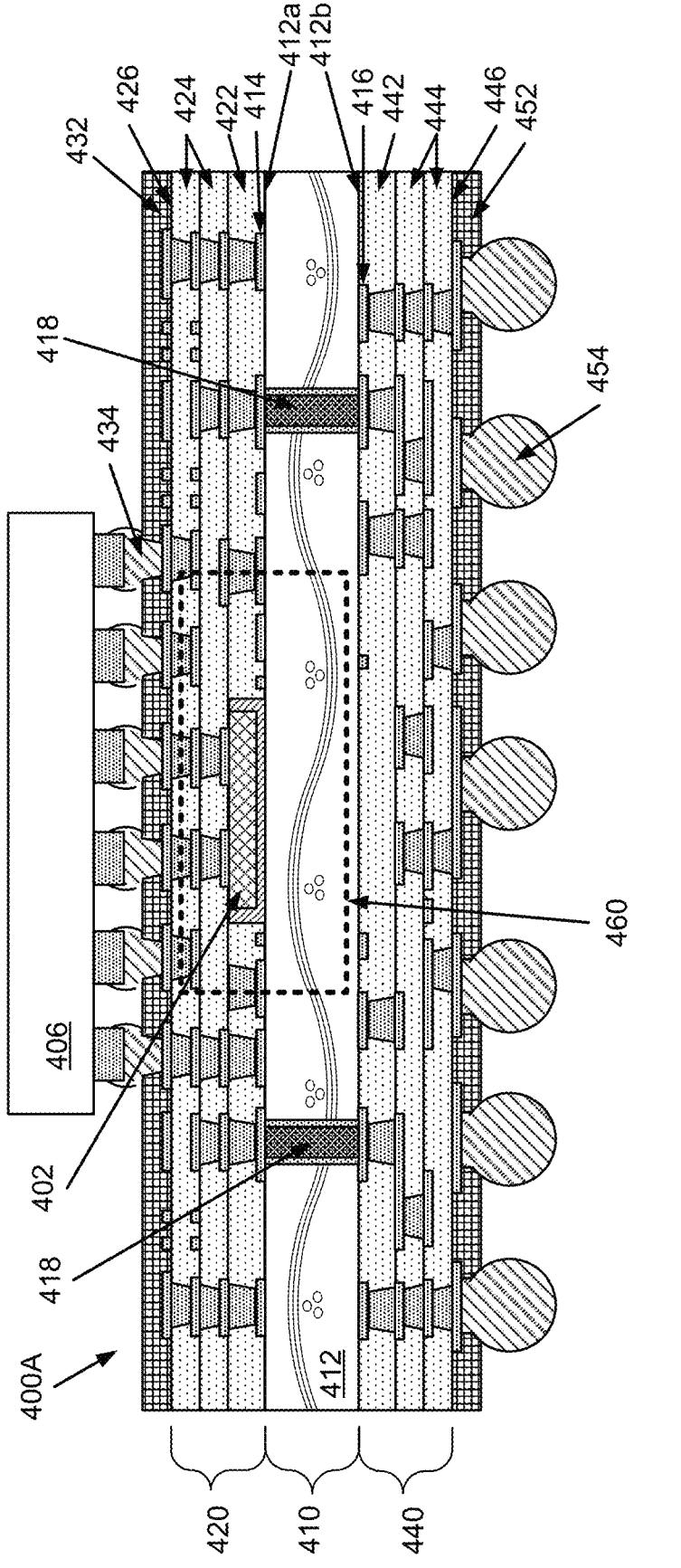
FIG. 4A is a cross-sectional view of a third example substrate with an embedded electronic component and an integrated circuit (IC) device, according to aspects of the disclosure.

FIG. 4A is a cross-sectional view of a third example substrate 400A with an embedded electronic component 402 and an integrated circuit (IC) device 406, according to aspects of the disclosure. In some aspects, the electronic component 402 may include one or more of active components (e.g., transistors), one or more passive components (e.g., diodes, resistors, inductors, capacitors, and/or deep trench capacitors), or any combination thereof.

As shown in FIG. 4A, the substrate 400A includes a core 410, and the core 410 includes a core dielectric 412 having a first surface 412a and a second surface 412b, a first conductive pattern 414 on the first surface 412a of the core dielectric 412, and a second conductive pattern 416 on the second surface 412b of the core dielectric 412. One or more conductive via structures 418 may be formed through the core of the core dielectric 412 and connecting a portion of the first conductive pattern 414 with a portion of the second conductive pattern 416.

The substrate 400A also includes a first metallization structure 420 over the first surface 412a of the core dielectric 412. The first metallization structure 420 includes a first dielectric 422 over the first surface 412a of the core dielectric 412 and one or more other dielectrics 424 over the first dielectric 422. The first metallization structure 420 also includes conductive patterns and vias (depicted with a dark shade and not labeled) formed within the dielectrics 422 and 424. Moreover, a top dielectric 432 may be formed over the one or more other dielectrics 424, and first conductive terminals 434 may be formed on an upper surface 426 of the first metallization structure 420. The first conductive terminals 434 may be electrically coupled with at least a portion of the first conductive pattern 414 through the first metallization structure 420. The IC device 406 may be mounted on the substrate 400A and electrically coupled with the first conductive terminals 434. In some aspects, the first conductive terminals 434 and the second conductive terminals 454 may include solder balls and/or conductive pillars.

The substrate 400A further includes a second metallization structure 440 under the second surface 412b of the core dielectric 412. The second metallization structure 440 includes a second dielectric 442 under the second surface 412b of the core dielectric 412 and one or more other dielectrics 444 under the second dielectric 442. The second metallization structure 440 also includes conductive patterns and vias (depicted with a dark shade and not labeled) formed within the dielectrics 442 and 444. Moreover, a bottom dielectric 452 may be formed under the one or more other dielectrics 444, and second conductive terminals 454 may be formed on a lower surface 446 of the second metallization structure 440. The second conductive terminals 454 may be electrically coupled with at least a portion of the second conductive pattern 416 through the second metallization structure 440. In some aspects, the substrate 400A may be mounted on and electrically coupled with a circuit board (not shown) via the second conductive terminals 454.

Figure 4B:
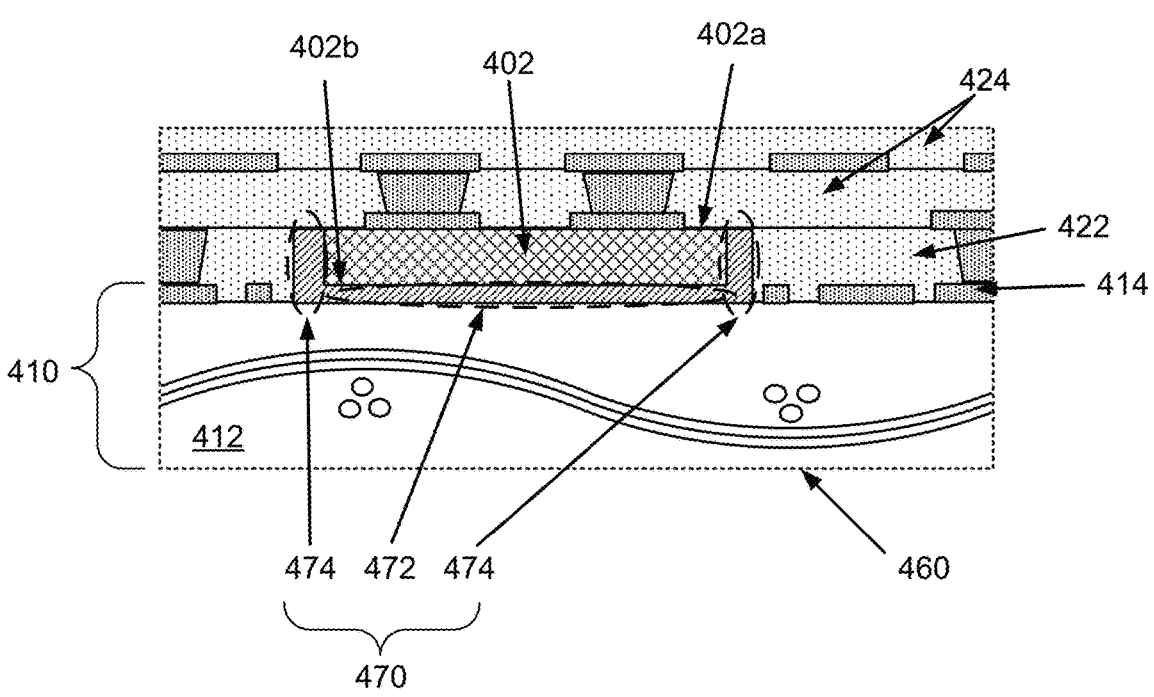
FIG. 4B is an enlarged view of a region in FIG. 4A, according to aspects of the disclosure.

FIG. 4A depicts a region 460, and FIG. 4B is an enlarged view of the region 460, according to aspects of the disclosure. The components depicted in FIG. 4B that are the same as those in FIG. 4A are depicted based on the same shades and given the same reference numbers.

As shown in FIG. 4B, the first dielectric 422 has an opening (not labeled) formed therein to accommodate the electronic component 402 and an adhesive structure 470. In some aspects, the adhesive structure 470 may include an adhesive layer 472 and an extended portion 474, where the electronic component 402 may be disposed in the opening of the first dielectric 422, and the adhesive layer 472 may couple the electronic component 402 with the core 410. In some aspects, the adhesive layer 472 and the extended portion 474 may comprise or may be made of a resin material. As shown in FIG. 4B, a space between a sidewall of the opening and a sidewall of the electronic component 402 may be at least partially filled with the resin material to become the extended portion 474 of the adhesive structure 470. In some aspects, a thickness of the electronic component 402 is equal to or less than a thickness of the first dielectric 422. In some aspects, the first dielectric 422 may include one or more dielectric layers, one or more layers of conductive patterns, and one or more layers of vias.

In some aspects, the electronic component 402 may include a first side 402a that has conductive terminals (e.g., a terminal side) and a second side 402b that is opposite to the first side and has no conductive terminals (e.g., a back side). In some aspects, the electronic component 402 may be placed in a manner that the second side (e.g., the back side) 402b faces the core dielectric 412, and that the first side (e.g., a terminal side) 402a faces away from the core dielectric 412 and to be electrically coupled with one or more conductive features of the first metallization structure 420 therefrom.

In some aspects, the adhesive layer 472 may include the resin material that may include a polymer resin, an epoxy resin, or a combination thereof. In some aspects, the resin material may be a thermal setting material. In some aspects, the resin material may be of a film or a liquid type when it is in an uncured form or a partially cured form.

In some aspects, the electronic component 402 placed in the first dielectric 422 on the core 410 may improve design flexibility for routing of the conductive paths (including the conductive pattern 414 and the conductive structures of the first metallization structure 420) in order to save the space and/or achieved an enhanced performance. Also, according to the example of FIGS. 4A and 4B, there is no core thickness dependency for component placement in the substrate. In some aspects, the resin material may be dispensed based on a volume that would not cause the overall thickness of the resin material and the electronic component 402 over the thickness of the first dielectric 422. In some aspects, the electronic component 402 may be a deep trench capacitor, a die-side capacitor, or a land-side capacitor.

Figure 4C:
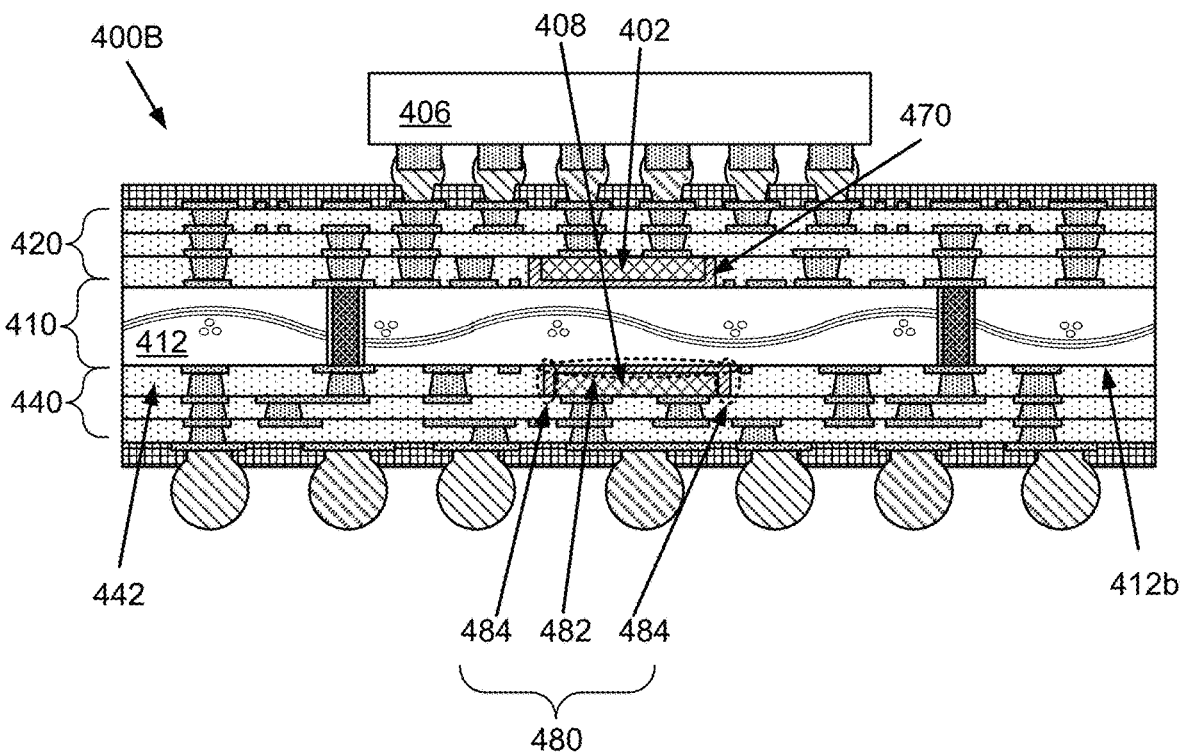
FIG. 4C is a cross-sectional view of a fourth example substrate with embedded electronic components and an IC device, according to aspects of the disclosure.

FIG. 4C is a cross-sectional view of a fourth example substrate 400B with embedded electronic components 402 and 408 and an IC device 406, according to aspects of the disclosure. In some aspects, the substrate 400B may be a variation of the substrate 400A. The components depicted in FIG. 4C that are the same as those in FIGS. 4A and 4B are depicted based on the same shades and given the same reference numbers.

Compared with the substrate 400A, the substrate 400B further includes another electronic component 408 mounted on the second surface 412b of the core dielectric 412. In some aspects, the second dielectric 442 has an opening (not labeled) formed therein to accommodate the electronic component 408 and an adhesive structure 480. In some aspects, the adhesive structure 480 may include an adhesive layer 482 and an extended portion 484, where the electronic component 408 may be disposed in the opening of the second dielectric 442, and the adhesive layer 482 may couple the electronic component 408 with the core 410.

In some aspects, the adhesive structure 480 and the electronic component 408 may be arranged in a manner similar to the adhesive structure 470 and the electronic component 402 as depicted in FIG. 4B. In some aspects, the electronic component 408 may include a first side that has conductive terminals (e.g., a terminal side) and a second side that is opposite to the first side and has no conductive terminals (e.g., a back side). In some aspects, the electronic component 408 may be placed in a manner that the second side (e.g., the back side) faces the core dielectric 412, and that the first side (e.g., a terminal side) faces away from the core dielectric 412 and to be electrically coupled with one or more conductive features of the second metallization structure 440 therefrom.

Figure 5A:
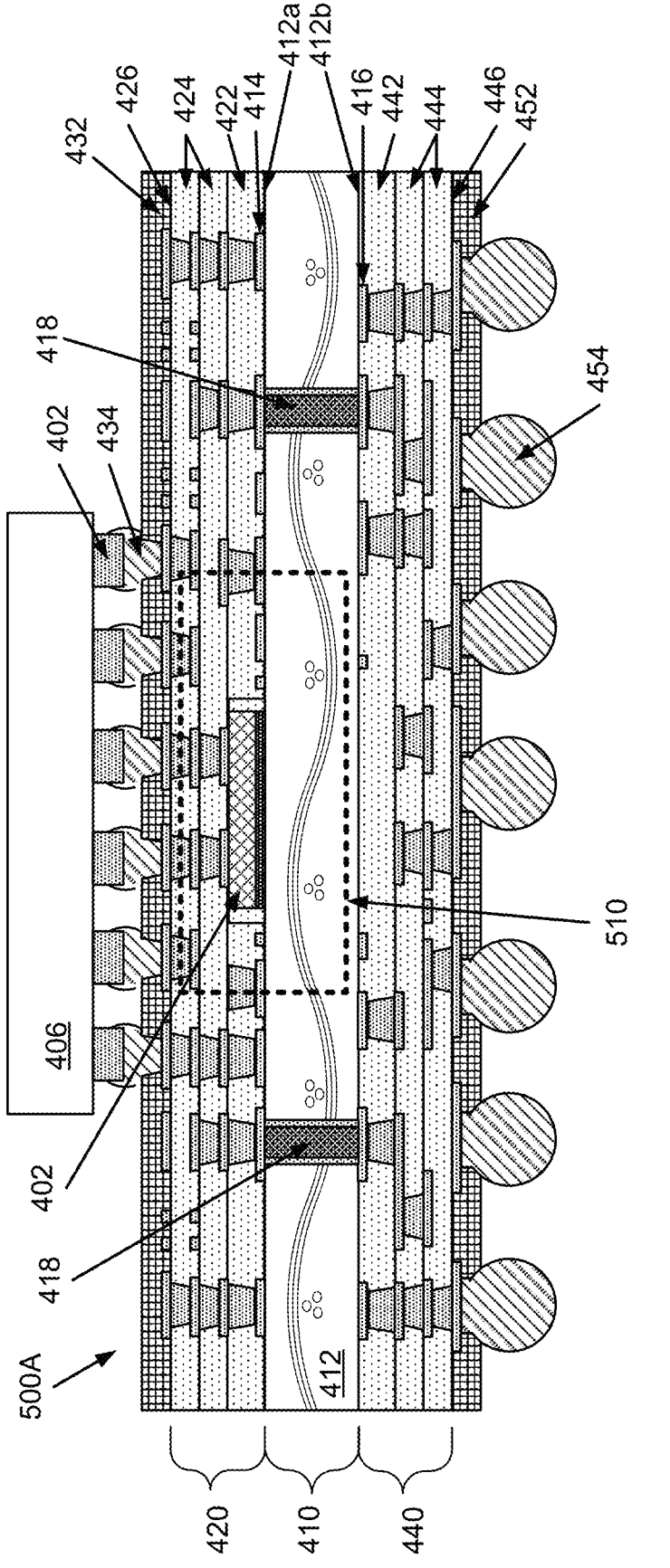
FIG. 5A is a cross-sectional view of a fifth example substrate with an embedded electronic component and an IC device, according to aspects of the disclosure.

FIG. 5A is a cross-sectional view of a fifth example substrate 500A with an embedded electronic component 402 and an IC device 406, according to aspects of the disclosure. In some aspects, the substrate 500A may be a variation of the substrate 400A. The components depicted in FIG. 5A that are the same as those in FIG. 4A are depicted based on the same shades and given the same reference numbers.

Figure 5B:
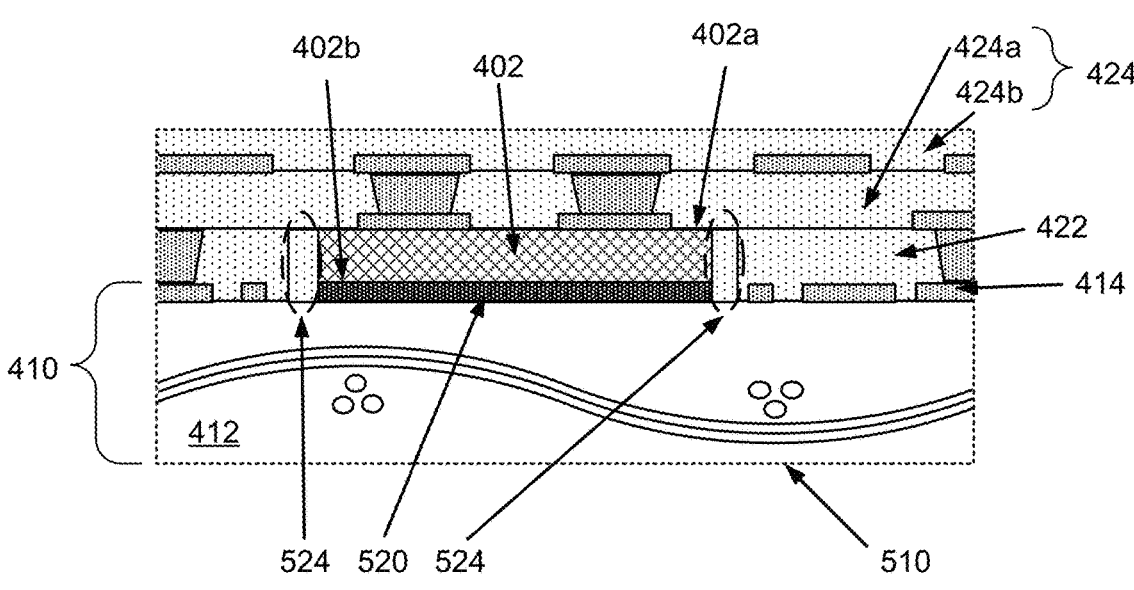
FIG. 5B is an enlarged view of a region in FIG. 5A, according to aspects of the disclosure.

Compared with the substrate 400A, the electronic component 402 is mounted on the core 410 of the substrate 500A based on a different approach. FIG. 5A depicts a region 510, and FIG. 5B is an enlarged view of the region 510, according to aspects of the disclosure. The components depicted in FIG. 5B that are the same as those in FIGS. 4A and 5A are depicted based on the same shades and given the same reference numbers.

As shown in FIG. 5B, the first dielectric 422 has an opening (not labeled) formed therein to accommodate the electronic component 402 and an adhesive layer 520. In some aspects, the electronic component 402 may be disposed in the opening of the first dielectric 422, and the adhesive layer 520 may couple the electronic component 402 with the core 410. In some aspects, the adhesive layer 520 may include a bonding film. As shown in FIG. 5B, the one or more other dielectrics 424 may include a dielectric 424a over the first dielectric 422, and a dielectric 424b over the dielectric 424a. In some aspects, the dielectric 424a may include a dielectric material, and a space between a sidewall of the opening and a sidewall of the electronic component 402 may be at least partially filled with the dielectric material to become the filling portion 524. In some aspects, a thickness of the electronic component 402 is equal to or less than a thickness of the first dielectric 422. In some aspects, the first dielectric 422 may include one or more dielectric layers, one or more layers of conductive patterns, and one or more layers of vias.

In some aspects, the adhesive layer 520 may include an adhesive material that is based on a resin material, a non-resin material, or a combination thereof. In some aspects, the resin material may include a polymer resin, an epoxy resin, or a combination thereof. In some aspects, the resin material may be a thermal setting material. In some aspects, the resin material may be of a film or a liquid type when it is in an uncured form or a partially cured form.

Figure 5C:
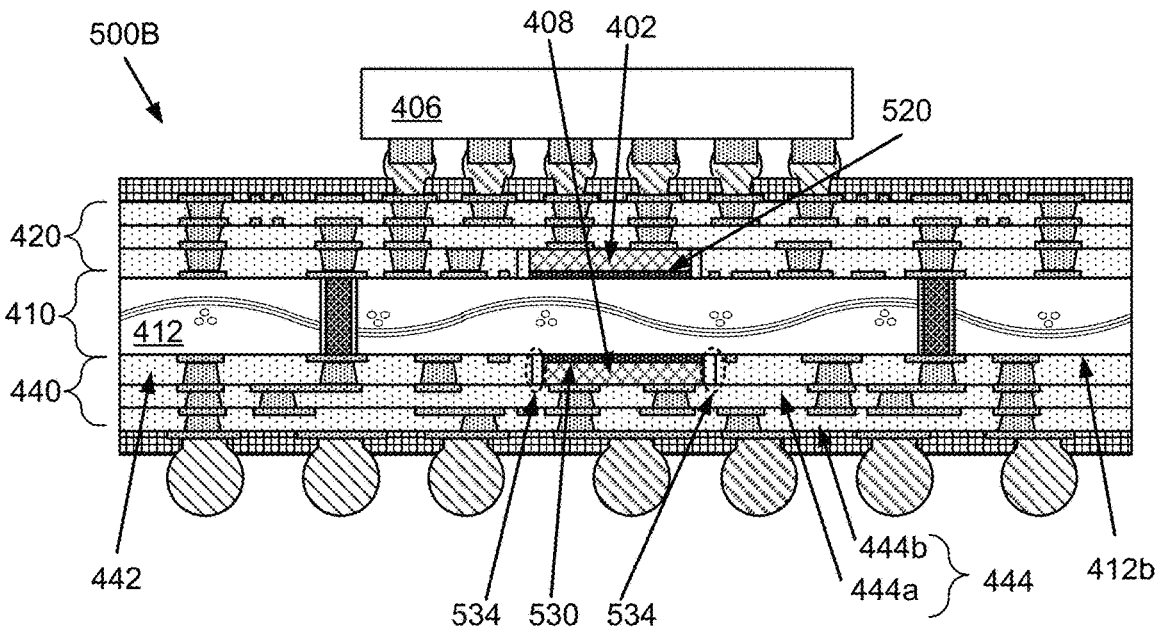
FIG. 5C is a cross-sectional view of a sixth example substrate with embedded electronic components and an IC device, according to aspects of the disclosure.

FIG. 5C is a cross-sectional view of a sixth example substrate 500B with embedded electronic components 402 and 408 and an IC device 406, according to aspects of the disclosure. In some aspects, the substrate 500B may be a variation of the substrate 500A. The components depicted in FIG. 5B that are the same as those in FIGS. 5A and 5B are depicted based on the same shades and given the same reference numbers.

Compared with the substrate 500A, the substrate 500B further includes another electronic component 408 mounted on the second surface 412b of the core dielectric 412. In some aspects, the second dielectric 442 has an opening (not labeled) formed therein to accommodate the electronic component 408 and an adhesive layer 530. In some aspects, the electronic component 408 may be disposed in the opening of the second dielectric 442, and the adhesive layer 530 may couple the electronic component 408 with the core 410. In some aspects, the adhesive layer 530 and the electronic component 408 may be arranged in a manner similar to the adhesive layer 520 and the electronic component 402 as depicted in FIG. 5B. For example, the one or more other dielectrics 444 may include a dielectric 444a and a dielectric 444b, a space between a sidewall of the opening and a sidewall of the electronic component 408 may be at least partially filled with the dielectric material of the dielectric 444a to become the filling portion 534.

FIGS. 6A-6M illustrate structures at various stages of manufacturing an example substrate 400A of FIG. 4A, according to aspects of the disclosure. The components illustrated in FIGS. 6A-6M that are the same or similar to those of FIG. 4A are given the same reference numbers, and the detailed description thereof may be omitted.

Figure 6A:
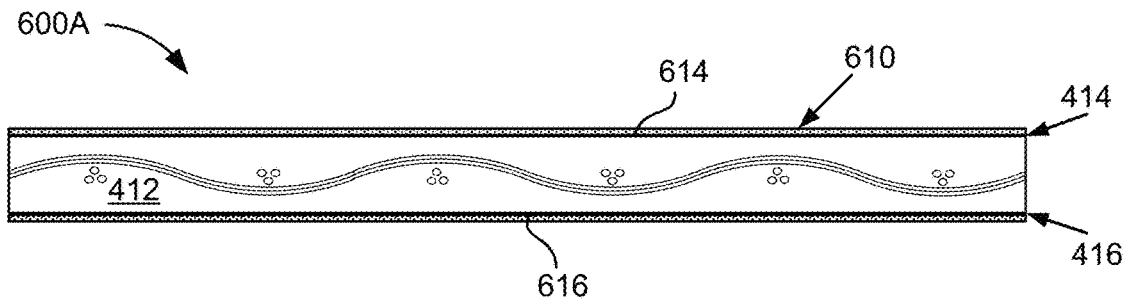
FIGS. 6A-6M illustrate structures at various stages of manufacturing an example substrate of FIG. 4A, according to aspects of the disclosure.

As shown in FIG. 6A, a structure 600A which includes a core 610 is provided. The core 610 includes a core dielectric 412, a first conductive layer 614 on a first surface 412a of the core dielectric 412, and a second conductive layer 616 on a second surface 412b of the core dielectric 412. In some aspects, the core 610 is a copper clad laminate (CCL) core, where the first and second conductive layers 614 and 616 include copper, and the core dielectric 412 includes a combination of epoxy resin and glass fibers.

Figure 6B:
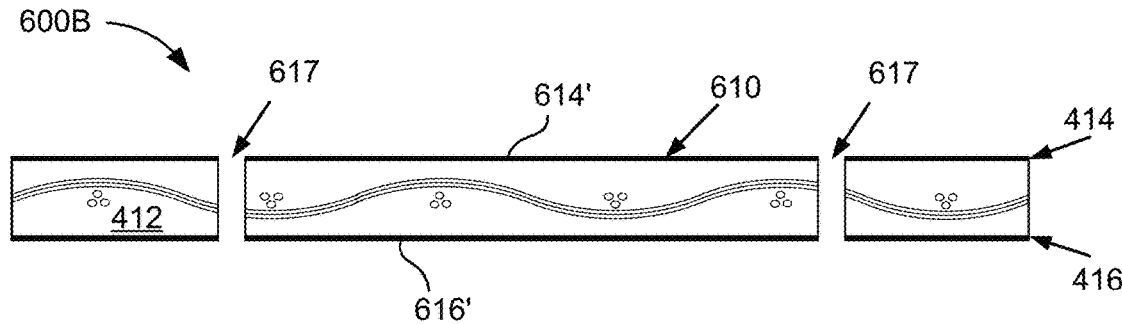

As shown in FIG. 6B, a structure 600B is formed based on the structure 600A by forming one or more holes 617 through the core 610. In some aspects, the one or more holes 617 may be formed based on mechanical drilling or laser drilling. In some aspects, the thicknesses of the first and second conductive layers 614 and 616 may be reduced to become reduced conductive layers 614' and 616'.

Figure 6C:
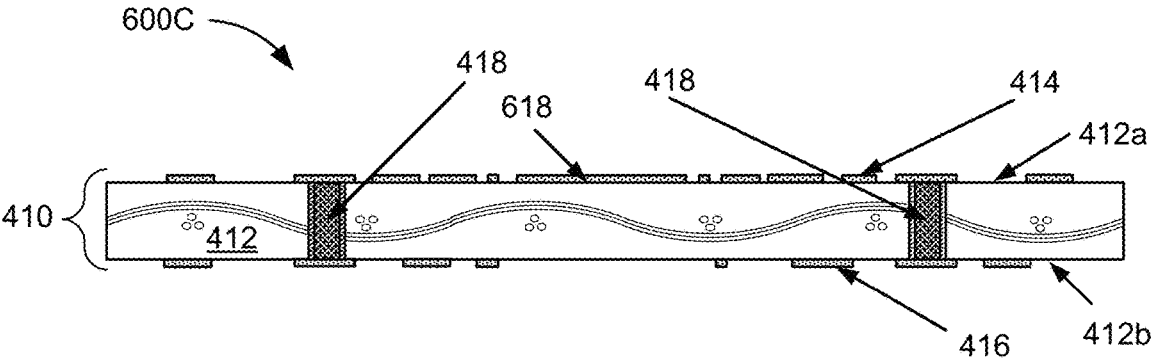

As shown in FIG. 6C, a structure 600C is formed based on the structure 600B by forming one or more conductive via structures 418 in the one or more holes 617, and forming a first conductive pattern 414 on the first surface 412a and a second conductive pattern 416 on the second surface 412b by patterning a mask covering the reduced conductive layers 614' and 616' and conductive material plating and cleaning based on the patterned mask on the conductive layers 614' and 616'. In some aspects, the structure 600C may correspond to the core 410 of FIG. 4A. In some aspects, the first conductive pattern 414 may include a copper stopper 618.

Figure 6D:
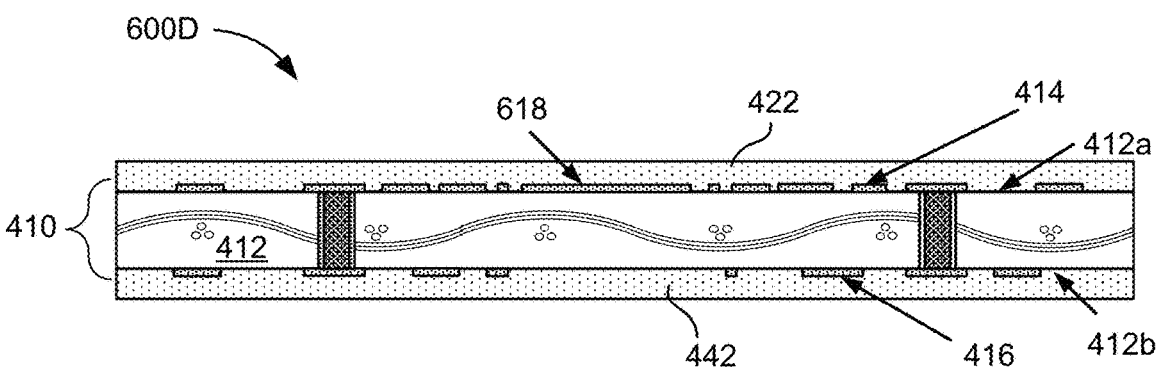

As shown in FIG. 6D, a structure 600D is formed based on the structure 600C by forming a first dielectric 422 over the core 410 and forming a second dielectric 442 under the core 410. The first dielectric 422 is disposed over the first surface 412a of the core dielectric 412; and the second dielectric 442 is disposed under the second surface 412b of the core dielectric 412. In some aspects, the first dielectric 422 may be formed based on applying a first layer of lamination material on the first surface 412a and the first conductive pattern 414; and the second dielectric 442 may be formed based on applying a second layer of lamination material on the second surface 412b and the second conductive pattern 416. In some aspects, the first layer of lamination material and the second layer of lamination material may include an Ajinomoto build-up film (ABF) or a prepreg.

Figure 6E:
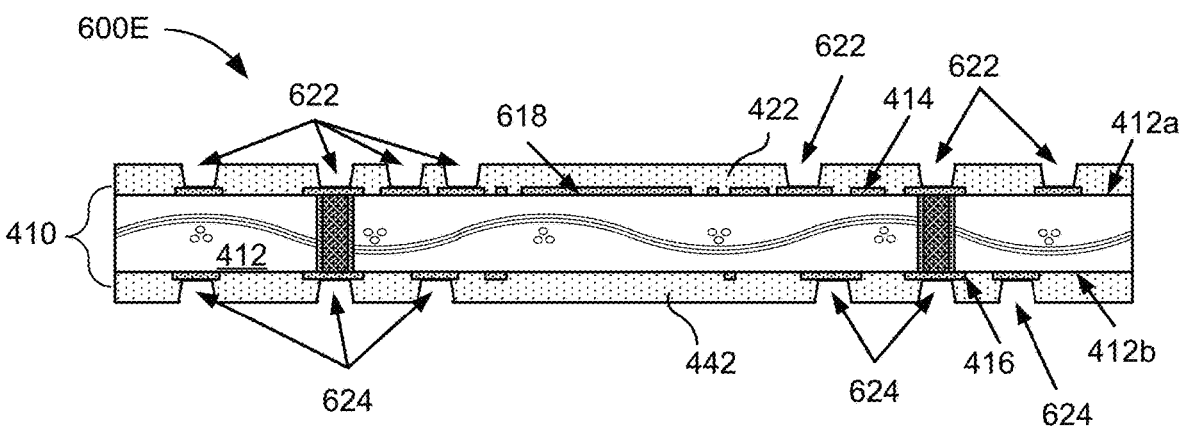

As shown in FIG. 6E, a structure 600E is formed based on the structure 600D by forming openings 622 in the first dielectric 422 to expose a portion of the first conductive pattern 414 and forming openings 624 in the second dielectric 442 to expose a portion of the second conductive pattern 416. In some aspects, the openings 622 and the openings 624 may be formed based on laser drilling or a wet etching process.

Figure 6F:
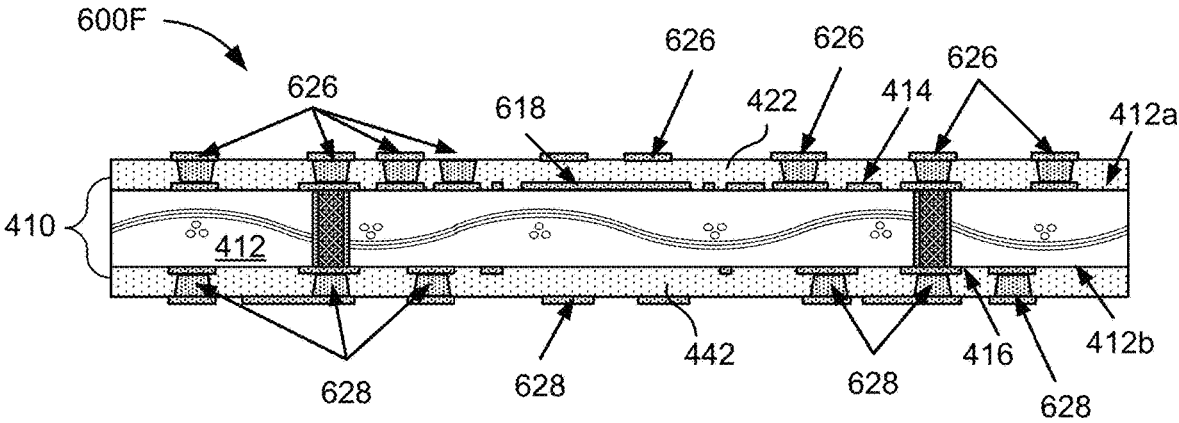

As shown in FIG. 6F, a structure 600F is formed based on the structure 600E by forming conductive structures 626 and 628 using the openings 622 and the openings 624. In some aspects, the conductive structures 626 and 628 may be formed based on an electroless plating process, a via filling process, a pattern plating process, and/or a seed layer removal process. In some aspects, the first dielectric 422, as well as the conductive structures 626, may be a portion of a first metallization structure (e.g., the first metallization structure 420) over the first surface 412a of the core dielectric 412. In some aspects, the second dielectric 442, as well as the conductive structures 628, may be a portion of a second metallization structure (e.g., the second metallization structure 440) under the second surface 412b of the core dielectric 412.

Figure 6G:
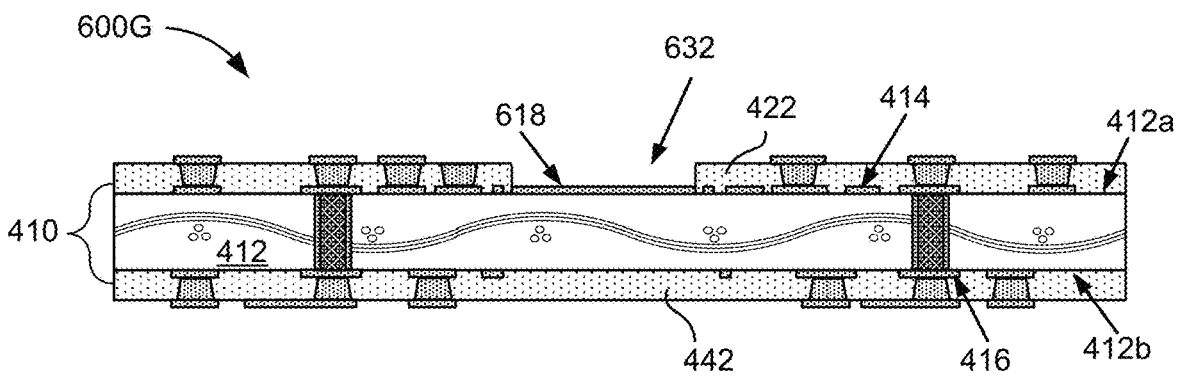

As shown in FIG. 6G, a structure 600G is formed based on the structure 600F by forming an opening 632 in the first dielectric 422, where the opening 632 exposes the copper stopper 618. In some aspects, the opening 632 may be formed based on laser drilling or a wet etching process.

Figure 6H:
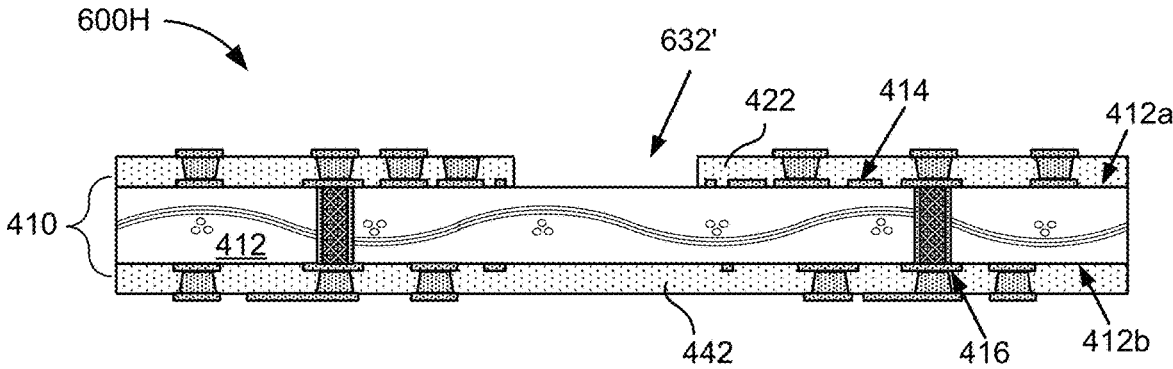

As shown in FIG. 6H, a structure 600H is formed based on the structure 600G by removing the copper stopper 618 in order to extend the opening 632 to become an opening 632', where the opening 632' now exposes a portion of the core 410 (e.g., the first surface 412a of the core dielectric 412). In some aspects, the opening 632' may be formed based on a wet etching process.

In some aspects, the copper stopper 618 may be omitted at the stage of FIG. 6C, and the stages of FIGS. 6G and 6H may be combined to form the opening 632'.

Figure 6I:
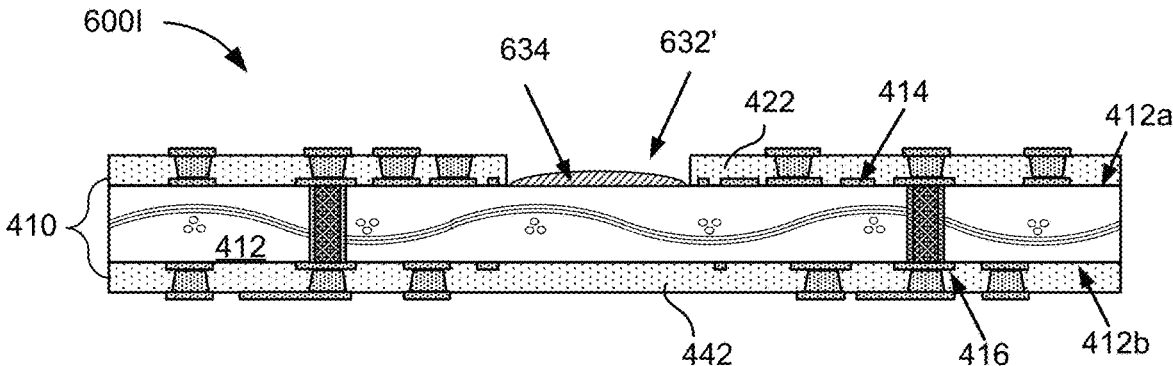

As shown in FIG. 6I, a structure 600I is formed based on the structure 600H by dispensing a resin material 634, in an uncured form or a partially cured form, in the opening 632' on at least a portion of the core 410. In some aspects, the resin material 634 may include a polymer resin, epoxy resin, or a combination thereof.

Figure 6J:
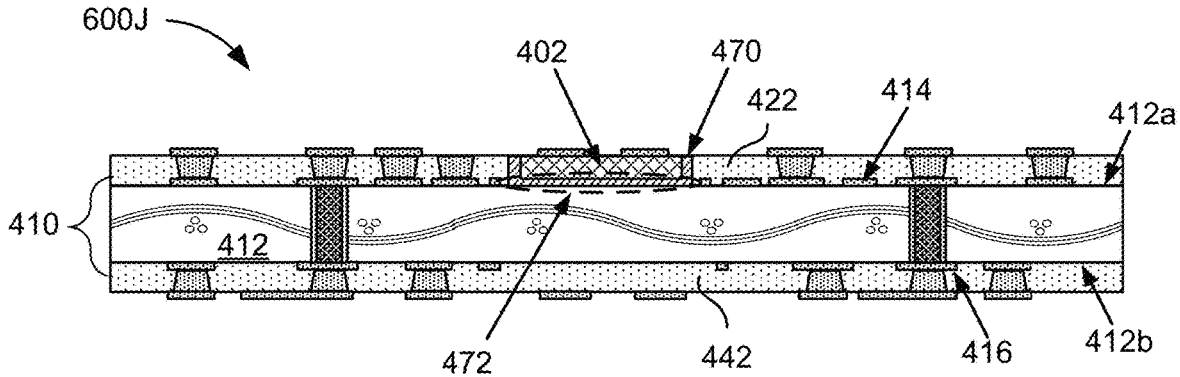

As shown in FIG. 6J, a structure 600J is formed based on the structure 600I by placing an electronic component 402 in the opening 632', wherein the dispensed resin material 634, in the uncured form or the partially cured form, at least partially fills a portion of a gap between the electronic component 402 and the core 410. In some aspects, the dispensed resin material 634, in the uncured form or the partially cured form, at least partially fills a space between a sidewall of the opening 632' and a sidewall of the electronic component 402. In some aspects, the dispensed resin material 634 may be cured such that the dispensed resin material, in a cured form, becomes an adhesive structure 470 that includes at least an adhesive layer 472 coupling the electronic component 402 with the core 410.

In some aspects, the electronic component 402 may include a first side that has conductive terminals (e.g., a terminal side) and a second side that is opposite to the first side and has no conductive terminals (e.g., a back side). In some aspects, the electronic component 402 may be placed in a manner that the second side (e.g., the back side) faces the core dielectric 412, and that the first side (e.g., a terminal side) faces away from the core dielectric 412.

Figure 6K:
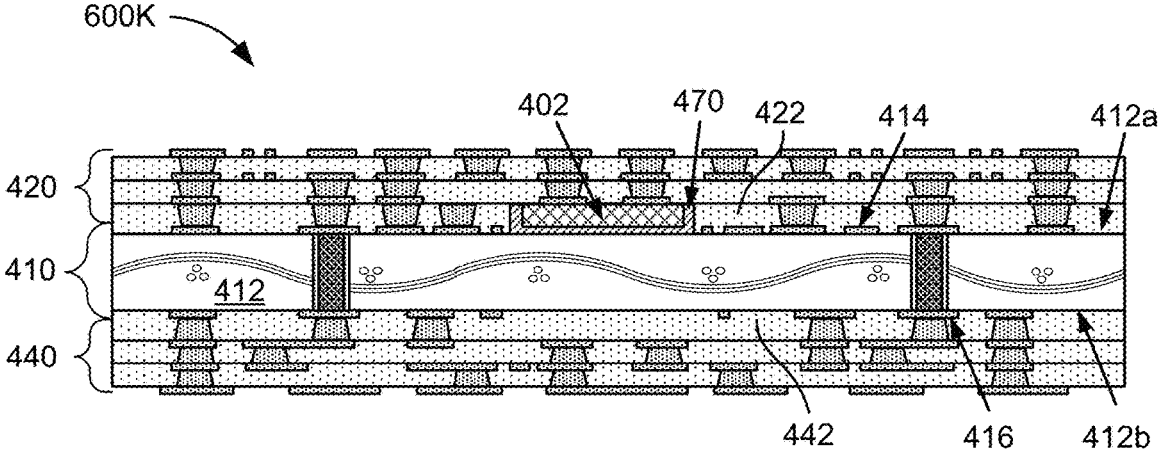

As shown in FIG. 6K, a structure 600K is formed based on the structure 600J by forming the remaining portion of the first metallization structure 420 over the first dielectric 422 and the electronic component 402, and forming the remaining portion of the second metallization structure 440 under the second dielectric 442. In some aspects, the first metallization structure 420 may include additional dielectrics and conductive structures that may be formed in a manner similar to forming the first dielectric 422 and the conductive structures 626 as illustrated with reference to FIGS. 6D-6F. In some aspects, the curing the dispensed resin material 634 after the electronic component 402 is placed thereon may be performed during a build-up curing process for the forming the remaining portion of the first metallization structure 420. Also, in some aspects, the second metallization structure 440 may include additional dielectrics and conductive structures that may be formed in a manner similar to forming the second dielectric 442 and the conductive structures 628 as illustrated with reference to FIGS. 6D-6F.

Figure 6L:
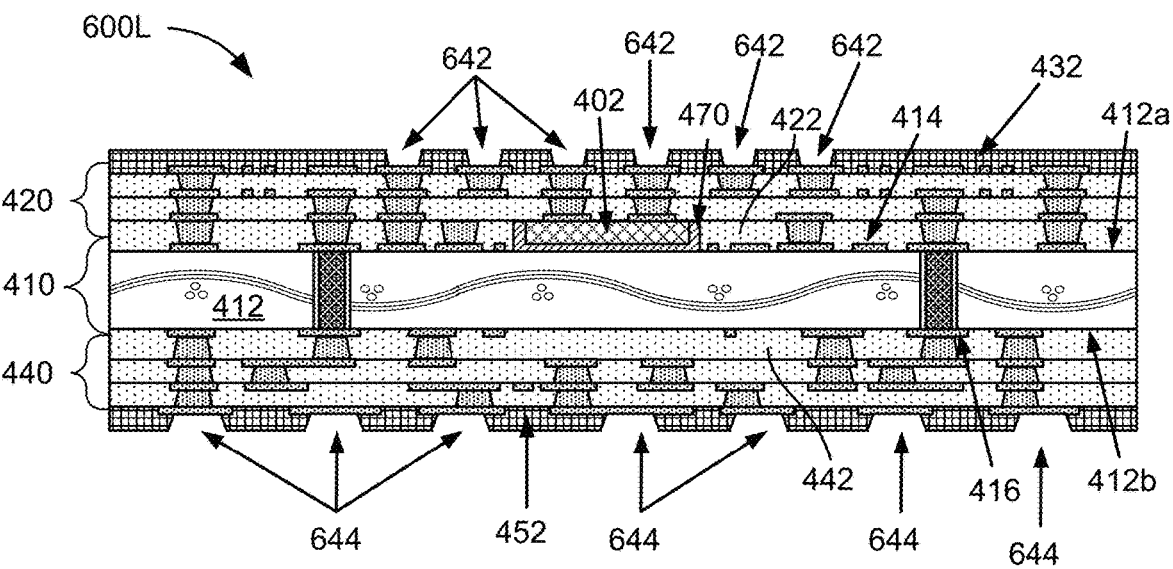

As shown in FIG. 6L, a structure 600L is formed based on the structure 600K by forming a top dielectric 432 over the first metallization structure 420, forming a bottom dielectric 452 under the second metallization structure 440, and forming openings 642 and 644 in the top dielectric 432 and the bottom dielectric 452. In some aspects, the openings 642 and 644 may expose a portion of an upper surface of the first metallization structure 420 and a portion of a lower surface of the second metallization structure 440. In some aspects, the openings 642 and 644 may be formed based on laser drilling or a wet etching process.

Figure 6M:
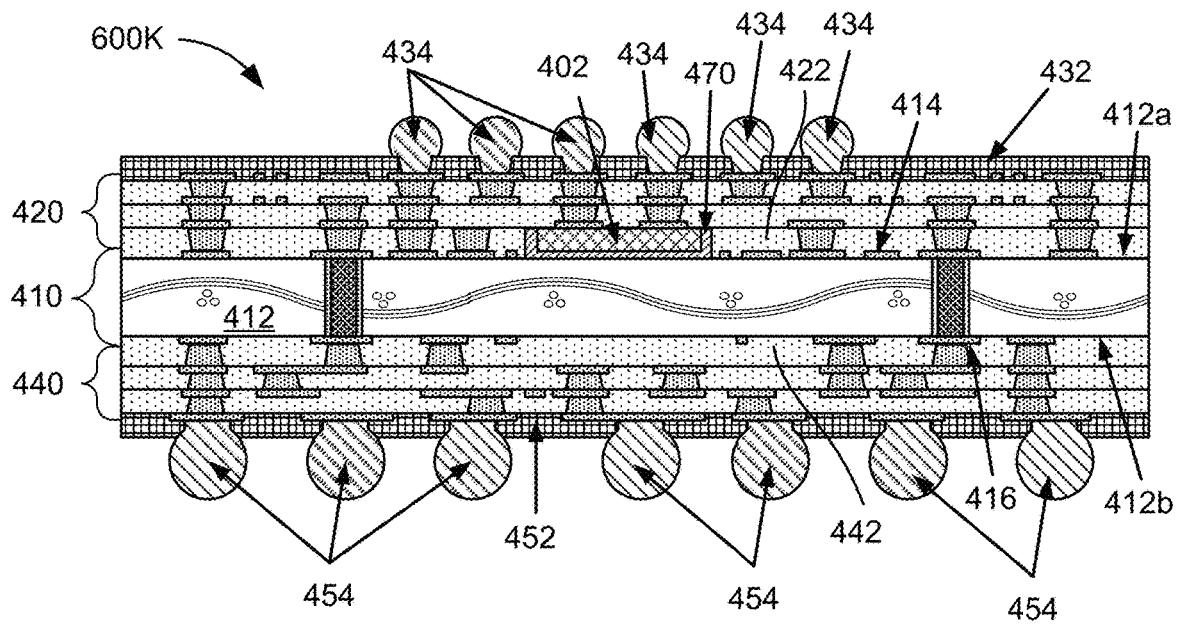

As shown in FIG. 6M, a structure 600M is formed based on the structure 600L by forming first conductive terminals 434 in the openings 642 over the first metallization structure 420, and forming second conductive terminals 454 in the openings 644 under the second metallization structure 440. In some aspects, structure 600M may correspond to the substrate 400A depicted in FIG. 4A.

In some aspects, the first conductive terminals 434 are formed on the upper surface of the first metallization structure 420, and the first conductive terminals 434 may be electrically coupled with at least a portion of the first conductive pattern 414 through the first metallization structure 420. In some aspects, the second conductive terminals 454 are formed on the lower surface of the second metallization structure 440, and the second conductive terminals 454 may be electrically coupled with at least a portion of the second conductive pattern 416 through the second metallization structure 440. In some aspects, the first conductive terminals 434 and the second conductive terminals 454 may include solder balls and/or conductive pillars.

Figure 6N:
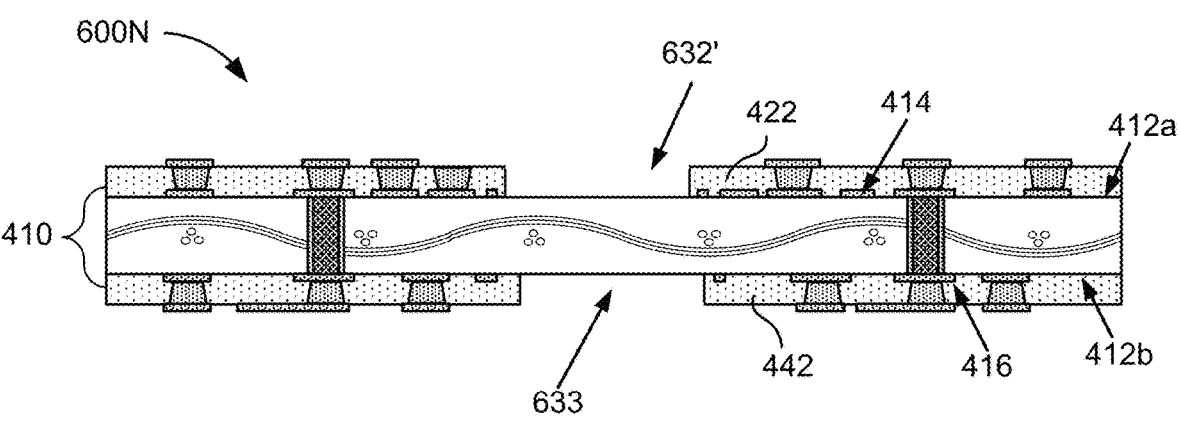
FIGS. 6N-6O illustrate structures at various stages of manufacturing an example substrate of FIG. 4C, according to aspects of the disclosure.
Figure 6O:
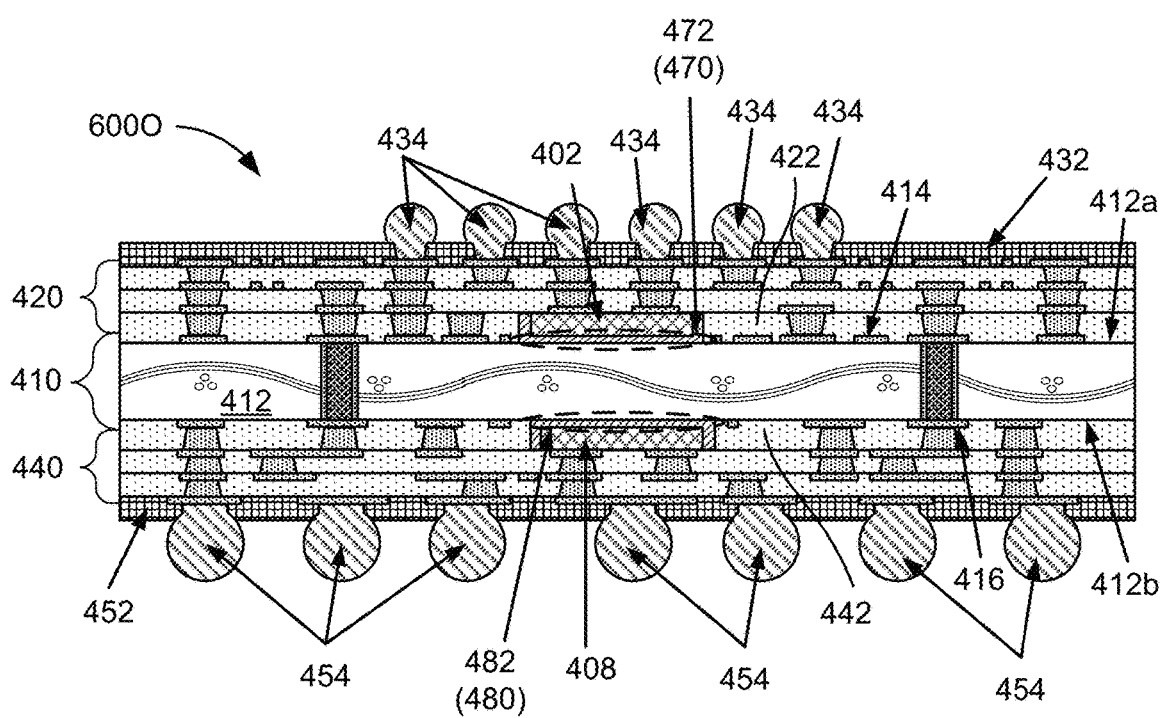

FIGS. 6N-6O illustrate structures at various stages of manufacturing an example substrate 400B of FIG. 4C, according to aspects of the disclosure. The components illustrated in FIGS. 6N-6O that are the same or similar to those of FIGS. 4A, 4C, and 6A-6M are given the same reference numbers, and the detailed description thereof may be omitted.

As shown in FIG. 6N, a structure 600N is formed based on the structure 600F by forming an opening 632' in the first dielectric 422 and forming an opening 633 in the second dielectric 442. In some aspects, the opening 632' and the opening 633 may be formed based on laser drilling or a wet etching process as discussed with reference to FIGS. 6G and 6H. In some aspects, the opening 632' exposes at least a portion of the core 410 (e.g., a portion of the first surface 412a of the core dielectric 412); and the opening 633 exposes at least another portion of the core 410 (e.g., a portion of the second surface 412b of the core dielectric 412).

As shown in FIG. 6O, a structure 600O is formed based on the structure 600N by mounting the electronic component 402 on the core 410 based on a first adhesive layer 472 of an adhesive structure 470 that couples the electronic component 402 with the core 410; and mounting the electronic component 408 on the core 410 based on a second adhesive layer 482 of an adhesive structure 480 that couples the electronic component 408 with the core 410. The electronic component 402 may be disposed in the opening 632' of the first dielectric 422; and the electronic component 408 may be disposed in the opening 633 of the second dielectric 442. Moreover, the remaining portion of a first metallization structure 420 is formed over the electronic component 402 and the first dielectric 422; a top dielectric 432 is formed over the first metallization structure 420, and first conductive terminals 434 are formed over the first metallization structure 420. Also, the remaining portion of a second metallization structure 440 is formed under the electronic component 408 and the second dielectric 442; a bottom dielectric 452 is formed under the second metallization structure 440; and second conductive terminals 454 are formed under the second metallization structure 440.

In some aspects, the electronic component 402 may include a first side that has conductive terminals (e.g., a terminal side) and a second side that is opposite to the first side and has no conductive terminals (e.g., a back side). In some aspects, the electronic component 402 may be placed in a manner that the second side (e.g., the back side) of the electronic component 402 faces the core dielectric 412, and that the first side (e.g., a terminal side) of the electronic component 402 faces away from the core dielectric 412 (e.g., facing the direction of the first conductive terminals 434 in FIG. 6O). In some aspects, the electronic component 408 may also include a first side that has conductive terminals (e.g., a terminal side) and a second side that is opposite to the first side and has no conductive terminals (e.g., a back side). In some aspects, the electronic component 408 may be placed in a manner that the second side (e.g., the back side) of the electronic component 408 faces the core dielectric 412, and that the first side (e.g., a terminal side) of the electronic component 408 faces away from the core dielectric 412 (e.g., facing the direction of the second conductive terminals 454 in FIG. 6O).

In some aspects, forming the structure 600O based on the structure 600N may be performed based on the operations as discussed with reference to FIGS. 6I-6M. In some aspects, structure 600O may correspond to the substrate 400B depicted in FIG. 4C.

Figure 7A:
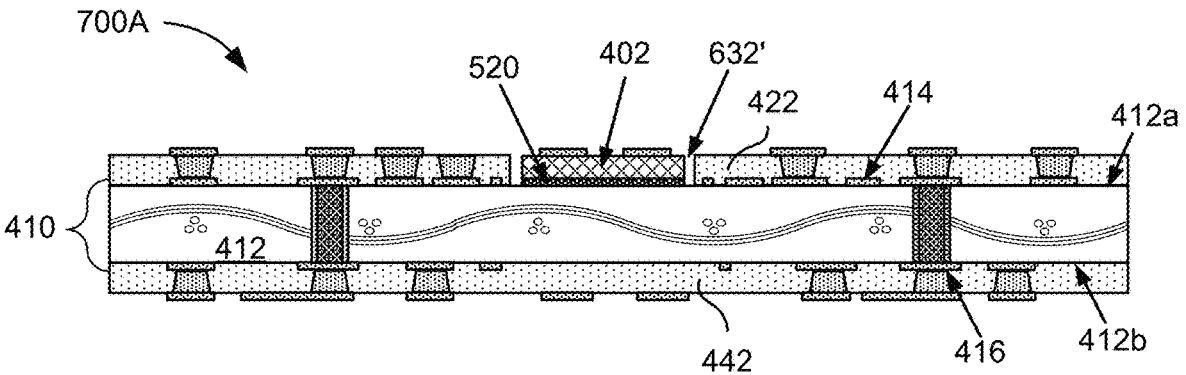
FIGS. 7A-7C illustrate structures at various stages of manufacturing an example substrate of FIG. 5A, according to aspects of the disclosure.
Figure 7B:
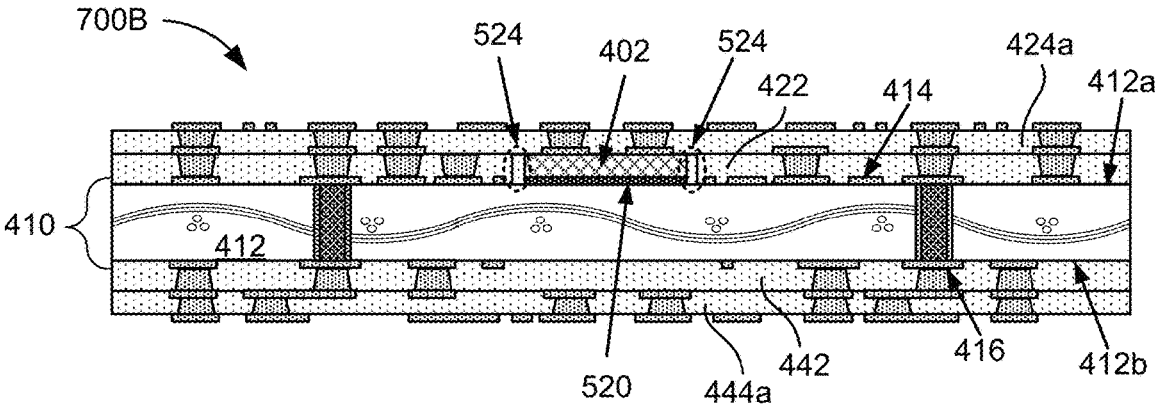
Figure 7C:
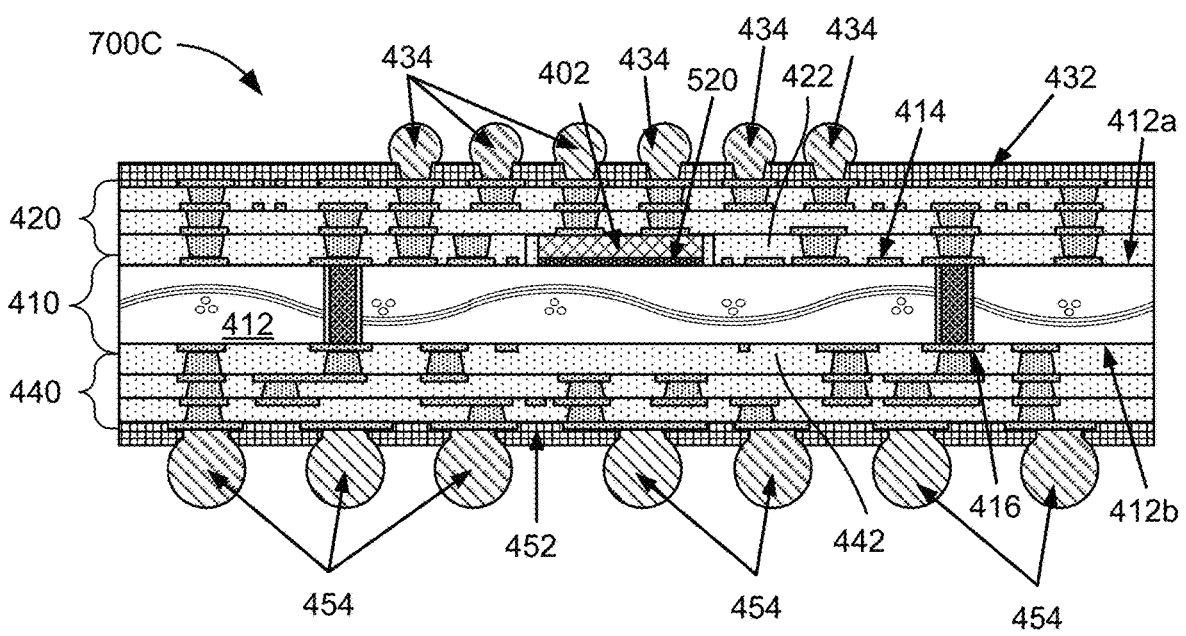

FIGS. 7A-7C illustrate structures at various stages of manufacturing an example substrate 500A of FIG. 5A, according to aspects of the disclosure. The components illustrated in FIGS. 7A-7C that are the same or similar to those of FIGS. 5A and 6A-6M are given the same reference numbers, and the detailed description thereof may be omitted.

As shown in FIG. 7A, a structure 700A is formed based on the structure 600H of FIG. 6H by placing the electronic component 402 with an adhesive layer 520 (e.g. including a bonding film) in the opening 632'. In some aspects, the bonding film may be first attached to the electronic component 402, and placed in the opening 632' together with the electronic component 402. In some aspects, the bonding film may be placed in the opening 632' first, and then the electronic component 402 may be placed on the bonding film. In some aspects, the adhesive layer 520 may include an adhesive material that is based on a resin material, a non-resin material, or a combination thereof. In some aspects, the resin material may include a polymer resin, an epoxy resin, or a combination thereof. In some aspects, the resin material may be a thermal setting material. In some aspects, the resin material may be of a film or a liquid type when it is in an uncured form or a partially cured form.

As shown in FIG. 7B, a structure 700B is formed based on the structure 700A by forming a dielectric 424a over the first dielectric 422, forming a dielectric 444a under the second dielectric 442, and forming contact structures within and on the dielectric 424a and the dielectric 444a. In some aspects, a space between a sidewall of the opening 632' and a sidewall of the electronic component 402 may be at least partially filled with the dielectric material of the dielectric 424a to become a filling portion 524. In some aspects, the filling portion 524 may be formed during the forming of the dielectric 424a. In some aspects, the forming of the dielectric 424a and the filling of the space to form the filling portion 524 may be performed based on applying a layer of lamination material, which may include an Ajinomoto build-up film (ABF) or a prepreg.

As shown in FIG. 7C, a structure 700C is formed based on the structure 700B by forming the remaining portion of a first metallization structure 420 over the electronic component 402 and the first dielectric 422; forming a top dielectric 432 over the first metallization structure 420, and forming first conductive terminals 434 over the first metallization structure 420. Also, the remaining portion of a second metallization structure 440 is formed under the second dielectric 442; a bottom dielectric 452 is formed under the second metallization structure 440; and second conductive terminals 454 are formed under the second metallization structure 440.

In some aspects, forming the structure 700C based on the structure 700B may be performed based on the operations as discussed with reference to FIGS. 6K-6M. In some aspects, structure 700C may correspond to the substrate 500A depicted in FIG. 5C.

Figure 7D:
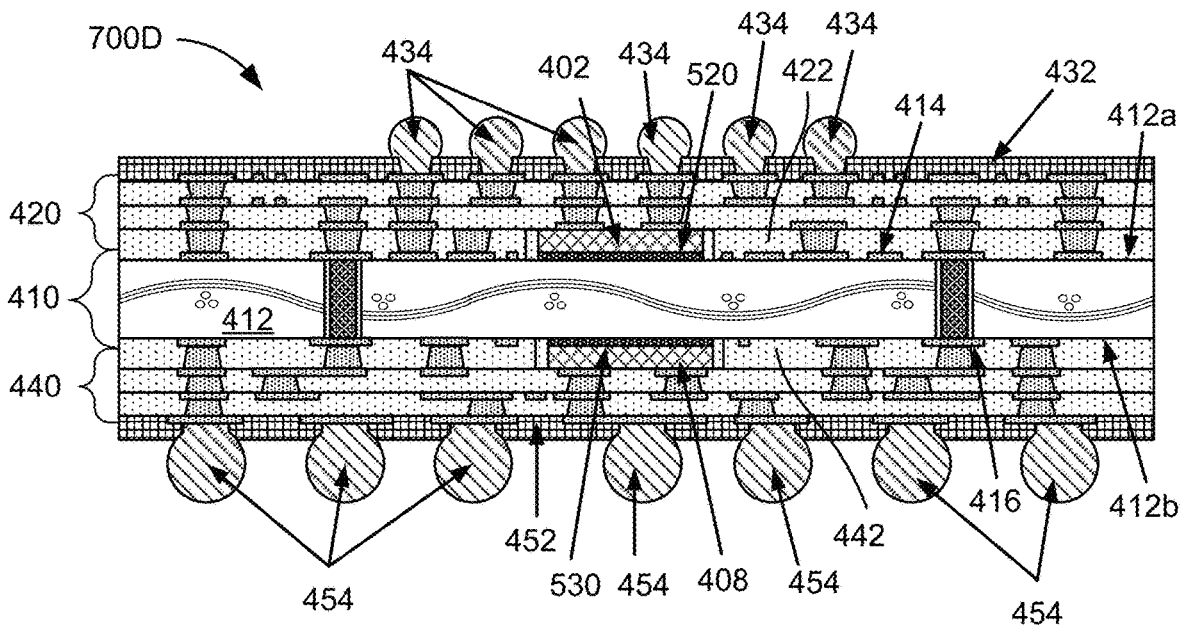
FIG. 7D illustrates a structure at a stage of manufacturing an example substrate of FIG. 5C, according to aspects of the disclosure.

FIG. 7D illustrates a structure at a stage of manufacturing an example substrate 500B of FIG. 5C, according to aspects of the disclosure. The components illustrated in FIG. 7D that are the same or similar to those of FIGS. 5A, 6A-6M, and 7A-7C are given the same reference numbers, and the detailed description thereof may be omitted.

As shown in FIG. 7D, a structure 700D is formed based on the structure 600N of FIG. 6N by mounting the electronic component 402 on the core 410 based on a first adhesive layer 520 that couples the electronic component 402 with the core 410; and mounting the electronic component 408 on the core 410 based on a second adhesive layer 530 that couples the electronic component 408 with the core 410. The electronic component 402 may be disposed in the opening 632' of the first dielectric 422; and the electronic component 408 may be disposed in the opening 633 of the second dielectric 442. Moreover, the remaining portion of a first metallization structure 420 is formed over the electronic component 402 and the first dielectric 422; a top dielectric 432 is formed over the first metallization structure 420, and first conductive terminals 434 are formed over the first metallization structure 420. Also, the remaining portion of a second metallization structure 440 is formed under the electronic component 408 and the second dielectric 442; a bottom dielectric 452 is formed under the second metallization structure 440; and second conductive terminals 454 are formed under the second metallization structure 440.

In some aspects, forming the structure 700D based on the structure 600N may be performed based on the operations as discussed with reference to FIGS. 7A-7C and 6K-6M. In some aspects, structure 700D may correspond to the substrate 500B depicted in FIG. 5C.

FIG. 8 illustrates a method 800 for manufacturing a substrate (such as the substrates 400A, 400B, 500A, and 500B), according to aspects of the disclosure.

At operation 810, a first dielectric (e.g., the first dielectric 422) is formed over a core (e.g., the core 410) of a substrate. The core may include a core dielectric (e.g., the core dielectric 412) and a first conductive pattern (e.g., the first conductive pattern 414) on a first surface (e.g., the first surface 412a) of the core dielectric. The first dielectric may be disposed over the first surface of the core dielectric, and the first dielectric may be a first portion of a first metallization structure (e.g., the first metallization structure 420) of the substrate over the first surface of the core dielectric.

In some aspects, operation 810 may further include forming a second dielectric (e.g., the second dielectric 442) under the core of the substrate, the core including a second conductive pattern (e.g., the second conductive pattern 416) on a second surface (e.g., the second surface 412b) of the core dielectric, the second dielectric being disposed under the second surface of the core dielectric, and the second dielectric being a first portion of a second metallization structure (e.g., the second metallization structure 440) of the substrate under the second surface of the core dielectric.

At operation 820, a first opening (e.g., the opening 632') of the first dielectric is formed, where the first opening exposes at least a first portion of the core. In some aspects, the first opening may be formed based on laser drilling or a wet etching process.

In some aspects, operation 820 may further include forming a second opening (e.g., the opening 633) of the second dielectric, where the second opening may expose at least a second portion of the core.

At operation 830, a first electronic component (e.g., the electronic component 402) is mounted on the core based on a first adhesive layer (e.g., the adhesive layer 472 or the adhesive layer 520) coupling the first electronic component with the core, where the first electronic component is disposed in the first opening of the first dielectric.

In some aspects, as illustrated with reference to FIGS. 6I-6J, operation 830 may include dispensing a resin material, in an uncured form or a partially cured form, in the first opening on at least the first portion of the core; placing the first electronic component in the first opening, wherein the dispensed resin material, in the uncured form or the partially cured form, at least partially fills a portion of a gap between the first electronic component and the core; and curing the dispensed resin material such that the dispensed resin material, in a cured form, becomes the first adhesive layer. In some aspects, the dispensed resin material, in the uncured form or the partially cured form, may at least partially fill a space between a sidewall of the first opening and a sidewall of the first electronic component.

In some aspects, as illustrated with reference to FIGS. 7A-7B, operation 830 may include placing the first electronic component together with a bonding film in the first opening, the bonding film being used as the first adhesive layer.

In some aspects, operation 830 may further include mounting a second electronic component (e.g., the electronic component 408) on the core based on a second adhesive layer (e.g., the adhesive layer 482 or the adhesive layer 530) coupling the second electronic component with the core, the second electronic component being disposed in the second opening of the second dielectric.

At operation 840, a second portion of the first metallization structure is formed over the first dielectric and the first electronic component. In some aspects, the curing the dispensed resin material at operation 830 may be performed during a build-up curing process for the forming the second portion of the first metallization structure.

In some aspects, operation 840 further includes forming a second portion of the second metallization structure under the second dielectric and/or the second electronic component.

A technical advantage of the method 800 is that it may be used to form a substrate with an embedded electronic component (e.g., deep trench capacitor) regardless of the thickness of the core, as the fabrication processes are not dependent on the thickness of the core.

Figure 9:
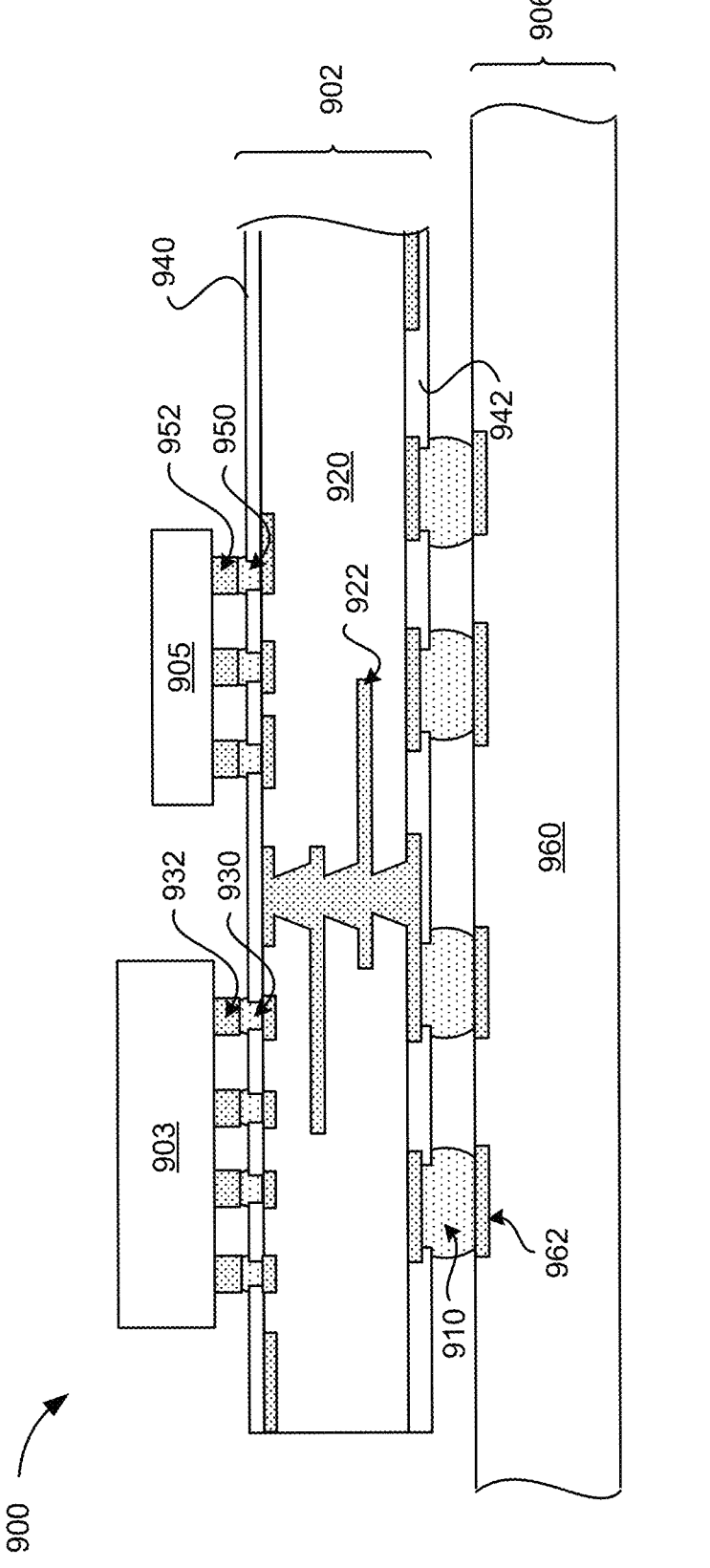
FIG. 9 illustrates a profile view of a package that includes a surface mount substrate, an integrated device and an integrated moisture sensor device, according to aspects of the disclosure.

FIG. 9 illustrates a profile view of a package 900 that includes a surface mount substrate 902, an integrated device 903, and an integrated passive device 905 (e.g., a substrate having an embedded deep trench device and a thick core), according to aspects of the disclosure. The package 900 may be coupled to a printed circuit board (PCB) 906 through a plurality of solder interconnects 910. The PCB 906 may include at least one board dielectric layer 960 and a plurality of board interconnects 962.

The surface mount substrate 902 includes at least one dielectric layer 920 (e.g., substrate dielectric layer), a plurality of interconnects 922 (e.g., substrate interconnects), a solder resist layer 940 and a solder resist layer 942. The integrated device 903 may be coupled to the surface mount substrate 902 through a plurality of solder interconnects 930. The integrated device 903 may be coupled to the surface mount substrate 902 through a plurality of pillar interconnects 932 and the plurality of solder interconnects 930. The integrated passive device 905 may be coupled to the surface mount substrate 902 through a plurality of solder interconnects 950. The integrated passive device 905 may be coupled to the surface mount substrate 902 through a plurality of pillar interconnects 952 and the plurality of solder interconnects 950.

The package (e.g., 900) may be implemented in a radio frequency (RF) package. The RF package may be a radio frequency front end (RFFE) package. A package (e.g., 900) may be configured to provide Wireless Fidelity (WiFi) communication and/or cellular communication (e.g., 2G, 3G, 4G, 5G). The package (e.g., 900.) may be configured to support Global System for Mobile (GSM) Communications, Universal Mobile Telecommunications System (UMTS), and/or Long-Term Evolution (LTE). The package (e.g., 900) may be configured to transmit and receive signals having different frequencies and/or communication protocols.

Figure 10:
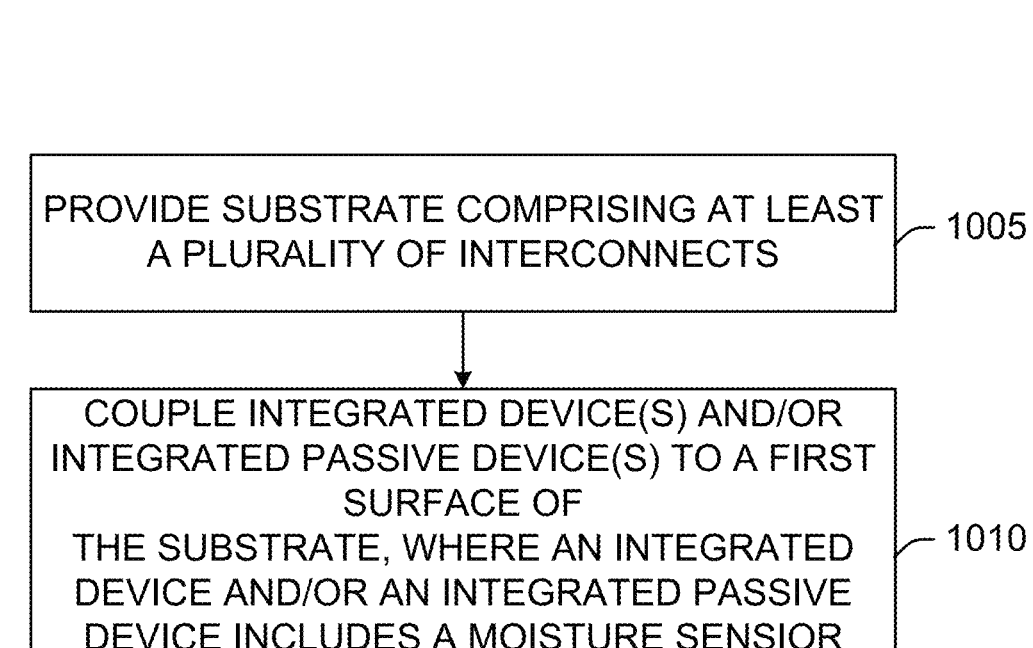
FIG. 10 illustrates an exemplary flow diagram of a method for fabricating a package that includes a substrate, an integrated device and an integrated passive device.

FIG. 10 illustrates an example method 1000 for providing or fabricating a package that includes an integrated device comprising a moisture sensor, according to aspects of the disclosure. In some implementations, the method 1000 of FIG. 10 may be used to provide or fabricate the package 900 of FIG. 9 described in the disclosure. However, the method 1000 may be used to provide or fabricate any of the packages described in the disclosure.

It should be noted that the method of FIG. 10 may combine one or more processes in order to simplify and/or clarify the method for providing or fabricating a package that includes an integrated device comprising a magnetic layer and/or an integrated passive device comprising a magnetic layer. In some implementations, the order of the processes may be changed or modified.

The method provides (at 1005) a substrate (e.g., 902). The substrate 902 may be provided by a supplier or fabricated. The substrate 902 includes at least one dielectric layer 920, and a plurality of interconnects 922. The substrate 902 may include an embedded trace substrate (ETS). In some implementations, the at least one dielectric layer 920 may include prepreg layers.

The method couples (at 1010) at least one integrated device (e.g., 903) to the first surface of the substrate (e.g., 902). For example, the integrated device 903 may be coupled to the substrate 902 through the plurality of pillar interconnects 932 and the plurality of solder interconnects 930. The plurality of pillar interconnects 932 may be optional. The plurality of solder interconnects 930 are coupled to the plurality of interconnects 922. A solder reflow process may be used to couple the integrated device 903 to the plurality of interconnects through the plurality of solder interconnects 930.

The method also couples (at 1010) at least one integrated passive device (e.g., 905) to the first surface of the substrate (e.g., 902). For example, the integrated passive device 905 may be coupled to the substrate 902 through the plurality of pillar interconnects 952 and the plurality of solder interconnects 950. The plurality of pillar interconnects 952 may be optional. The plurality of solder interconnects 950 are coupled to the plurality of interconnects 922. A solder reflow process may be used to couple the integrated passive device 905 to the plurality of interconnects through the plurality of solder interconnects 950.

The method couples (at 1015) a plurality of solder interconnects (e.g., 910) to the second surface of the substrate (e.g., 902). A solder reflow process may be used to couple the plurality of solder interconnects 910 to the substrate.

Figure 11:
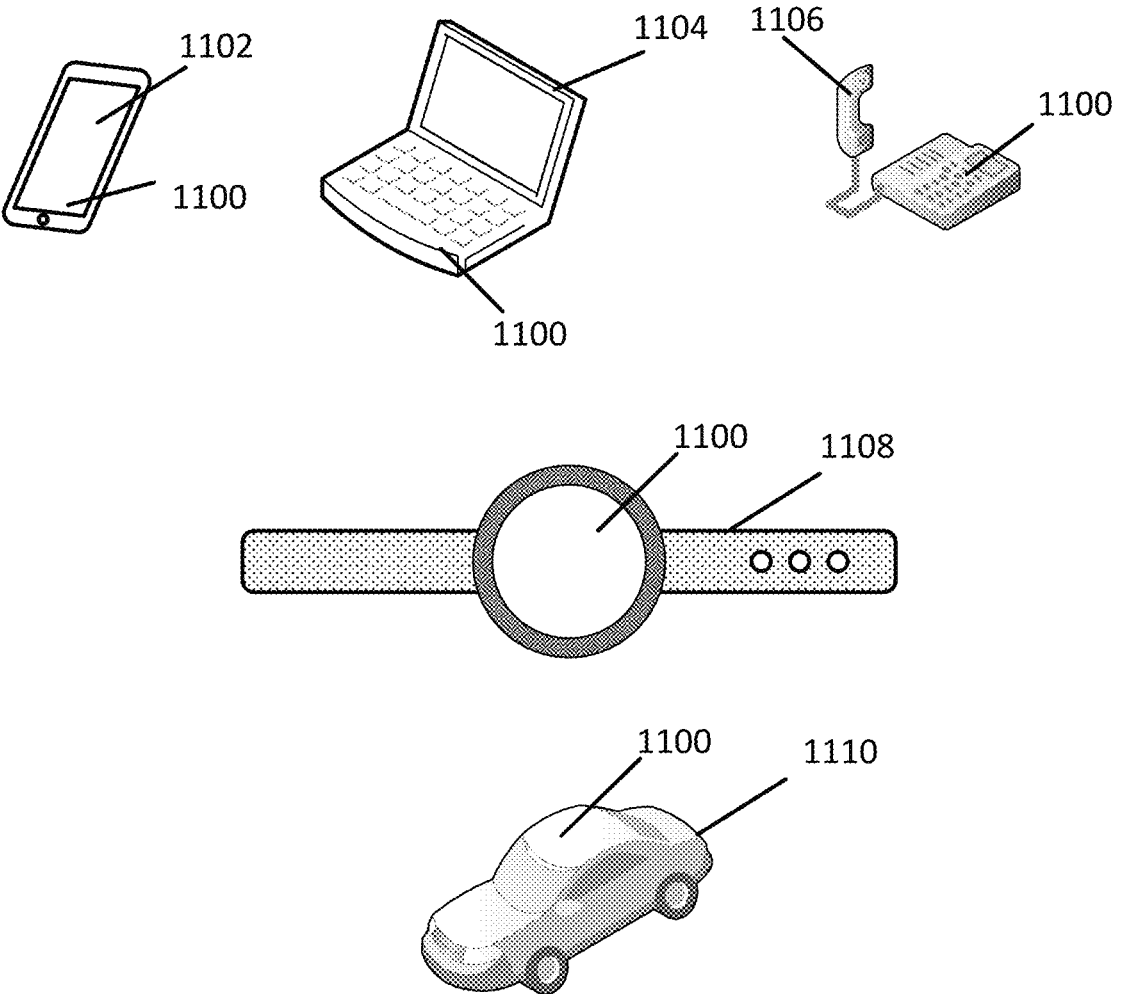
FIG. 11 illustrates various electronic devices that may integrate an electronic component, an electronic circuit, an integrated device, an integrated passive device, a passive component, a package, and/or a device package described herein.

FIG. 11 illustrates various electronic devices that may be integrated with any of the aforementioned devices, integrated devices, integrated circuit (IC) packages, integrated circuit (IC) devices, semiconductor devices, integrated circuits, electronic components, dies, interposer packages, package-on-package (POP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A substrate, comprising: a core that includes a core dielectric and a first conductive pattern on a first surface of the core dielectric; a first metallization structure over the first surface of the core dielectric, the first metallization structure including a first dielectric, and the first dielectric having a first opening formed therein; a first electronic component disposed in the first opening of the first dielectric; and a first adhesive layer coupling the first electronic component with the core.

Clause 2. The substrate of clause 1, wherein a thickness of the first electronic component is equal to or less than a thickness of the first dielectric.

Clause 3. The substrate of any of clauses 1 to 2, wherein the first adhesive layer comprises a resin material.

Clause 4. The substrate of clause 3, wherein a space between a sidewall of the first opening and a sidewall of the first electronic component is at least partially filled with the resin material.

Clause 5. The substrate of any of clauses 1 to 2, wherein the first adhesive layer includes a bonding film.

Clause 6. The substrate of clause 5, wherein: the first metallization structure further includes one other dielectric over the first dielectric, the one other dielectric comprising a dielectric material, and a space between a sidewall of the first opening and a sidewall of the first electronic component is at least partially filled with the dielectric material.

Clause 7. The substrate of any of clauses 1 to 6, wherein: the core includes a second conductive pattern on a second surface of the core dielectric, and the substrate further comprises: a second metallization structure under the second surface of the core dielectric, the second metallization structure including a second dielectric, and the second dielectric having a second opening formed therein; a second electronic component disposed in the second opening of the second dielectric; and a second adhesive layer coupling the second electronic component with the core.

Clause 8. The substrate of any of clauses 1 to 7, further comprising: first conductive terminals on an upper surface of the first metallization structure, the first conductive terminals being electrically coupled with at least a portion of the first conductive pattern through the first metallization structure.

Clause 9. The substrate of clause 8, wherein: the core includes a second conductive pattern on a second surface of the core dielectric, and the substrate further comprises: a second metallization structure under the second surface of the core dielectric; and second conductive terminals on a lower surface of the second metallization structure, the second conductive terminals being electrically coupled with at least a portion of the second conductive pattern through the second metallization structure.

Clause 10. The substrate of any of clauses 1 to 9, wherein the first adhesive layer comprises: a resin material that includes a polymer resin, an epoxy resin, or a combination thereof, or an adhesive material that is based on the resin material, a non-resin material, or a combination thereof.

Clause 11. The substrate of any of clauses 1 to 10, wherein the core is a copper clad laminate (CCL) core.

Clause 12. A method of manufacturing a substrate, comprising: forming a first dielectric over a core of the substrate, the core including a core dielectric and a first conductive pattern on a first surface of the core dielectric, the first dielectric being disposed over the first surface of the core dielectric, and the first dielectric being a first portion of a first metallization structure of the substrate over the first surface of the core dielectric; forming a first opening of the first dielectric, the first opening exposing at least a first portion of the core; mounting a first electronic component on the core based on a first adhesive layer coupling the first electronic component with the core, the first electronic component being disposed in the first opening of the first dielectric; and forming a second portion of the first metallization structure over the first dielectric and the first electronic component.

Clause 13. The method of clause 12, wherein the mounting the first electronic component on the core comprises: dispensing a resin material, in an uncured form or a partially cured form, in the first opening on at least the first portion of the core; placing the first electronic component in the first opening, wherein the dispensed resin material, in the uncured form or the partially cured form, at least partially fills a portion of a gap between the first electronic component and the core; and curing the dispensed resin material such that the dispensed resin material, in a cured form, becomes the first adhesive layer.

Clause 14. The method of clause 13, wherein the curing the dispensed resin material is performed during a build-up curing process for the forming the second portion of the first metallization structure.

Clause 15. The method of any of clauses 13 to 14, wherein the dispensed resin material, in the uncured form or the partially cured form, at least partially fills a space between a sidewall of the first opening and a sidewall of the first electronic component.

Clause 16. The method of clause 12, wherein the mounting the first electronic component on the core comprises: placing the first electronic component together with a bonding film in the first opening, the bonding film being used as the first adhesive layer.

Clause 17. The method of any of clauses 12 to 16, wherein: the forming the second portion of the first metallization structure comprises forming one other dielectric on the first dielectric, the one other dielectric including a dielectric material, and a space between a sidewall of the first opening and a sidewall of the first electronic component is at least partially filled with the dielectric material during the forming the one other dielectric on the first dielectric.

Clause 18. The method of clause 17, wherein: the forming the one other dielectric and the at least partially filling the space are performed based on applying a layer of lamination material on the first dielectric.

Clause 19. The method of clause 18, wherein the layer of lamination material includes an Ajinomoto build-up film (ABF) or a prepreg.

Clause 20. The method of any of clauses 12 to 19, further comprising: forming a second dielectric under the core of the substrate, the core including a second conductive pattern on a second surface of the core dielectric, the second dielectric being disposed under the second surface of the core dielectric, and the second dielectric being a first portion of a second metallization structure of the substrate under the second surface of the core dielectric; forming a second opening of the second dielectric, the second opening exposing at least a second portion of the core; mounting a second electronic component on the core based on a second adhesive layer coupling the second electronic component with the core, the second electronic component being disposed in the second opening of the second dielectric; and forming a second portion of the second metallization structure under the second dielectric and the second electronic component.

Clause 21. The method of any of clauses 12 to 19, further comprising: forming first conductive terminals on an upper surface of the first metallization structure, the first conductive terminals being electrically coupled with at least a portion of the first conductive pattern through the first metallization structure.

Clause 22. The method of clause 21, further comprising: forming a second metallization structure under the core of the substrate, the core including a second conductive pattern on a second surface of the core dielectric, and the second metallization structure being disposed under the second surface of the core dielectric; and forming second conductive terminals on a lower surface of the second metallization structure, the second conductive terminals being electrically coupled with at least a portion of the second conductive pattern through the second metallization structure.

Clause 23. The method of any of clauses 12 to 22, wherein the first adhesive layer comprises: a resin material that includes a polymer resin, an epoxy resin, or a combination thereof, or an adhesive material that is based on the resin material, a non-resin material, or a combination thereof.

Clause 24. The method of any of clauses 12 to 23, wherein the first electronic component includes one or more of active components, one or more passive components, or any combination thereof.

Clause 25. An electronic device, comprising: a substrate that includes: a core that includes a core dielectric and a first conductive pattern on a first surface of the core dielectric; a first metallization structure over the first surface of the core dielectric, the first metallization structure including a first dielectric, and the first dielectric having a first opening formed therein; a first electronic component disposed in the first opening of the first dielectric; and a first adhesive layer coupling the first electronic component with the core.

Clause 26. The electronic device of clause 25, wherein the first electronic component includes one or more of active components, one or more passive components, or any combination thereof.

Clause 27. The electronic device of any of clauses 25 to 26, wherein: the substrate further comprises first conductive terminals on an upper surface of the first metallization structure, the first conductive terminals being electrically coupled with at least a portion of the first conductive pattern through the first metallization structure, and the electronic device further comprises an integrated circuit (IC) device mounted on the substrate and electrically coupled with the first conductive terminals.

Clause 28. The electronic device of any of clauses 25 to 27, wherein: the core includes a second conductive pattern on a second surface of the core dielectric, and the substrate further comprises: a second metallization structure under the second surface of the core dielectric, the second metallization structure including a second dielectric, and the second dielectric having a second opening formed therein; a second electronic component disposed in the second opening of the second dielectric; and a second adhesive layer coupling the second electronic component with the core.

Clause 29. The electronic device of any of clauses 25 to 28, wherein the first adhesive layer comprises: a resin material that includes a polymer resin, an epoxy resin, or a combination thereof, or an adhesive material that is based on the resin material, a non-resin material, or a combination thereof.

Clause 30. The electronic device of any of clauses 25 to 29, wherein the electronic device comprises at least one of: a music player; a video player; an entertainment unit; a navigation device; a communications device; a mobile device; a mobile phone; a smartphone; a personal digital assistant; a fixed location terminal; a tablet computer, a computer; a wearable device; a laptop computer; a server; an internet of things (IoT) device; or a device in an automotive vehicle.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A substrate, comprising:
a core that includes a core dielectric and a first conductive pattern on a first surface of the core dielectric;
a first metallization structure over the first surface of the core dielectric, the first metallization structure including a first dielectric, and the first dielectric having a first opening formed therein;
a first electronic component disposed in the first opening of the first dielectric; and
a first adhesive layer coupling the first electronic component with the core,
wherein a space between a sidewall of the first dielectric and a sidewall of the first electronic component is at least partially filled with the first adhesive layer, and the first adhesive layer touches the sidewall of the first dielectric.

2. The substrate of claim 1, wherein a thickness of the first electronic component is equal to or less than a thickness of the first dielectric.

3. The substrate of claim 1, wherein the first adhesive layer comprises a resin material.

4. The substrate of claim 3, wherein the sidewall of the first dielectric is defined by the first opening of the first dielectric.

5. The substrate of claim 1, wherein the first adhesive layer includes a bonding film.

6. The substrate of claim 5, wherein:
the first metallization structure further includes one other dielectric over the first dielectric, the one other dielectric comprising a dielectric material.

7. The substrate of claim 1, wherein:
the core includes a second conductive pattern on a second surface of the core dielectric, and
the substrate further comprises:
a second metallization structure under the second surface of the core dielectric, the second metallization structure including a second dielectric, and the second dielectric having a second opening formed therein;
a second electronic component disposed in the second opening of the second dielectric; and
a second adhesive layer coupling the second electronic component with the core.

8. The substrate of claim 1, further comprising:
first conductive terminals on an upper surface of the first metallization structure, the first conductive terminals being electrically coupled with at least a portion of the first conductive pattern through the first metallization structure.

9. The substrate of claim 8, wherein:
the core includes a second conductive pattern on a second surface of the core dielectric, and
the substrate further comprises:
a second metallization structure under the second surface of the core dielectric; and
second conductive terminals on a lower surface of the second metallization structure, the second conductive terminals being electrically coupled with at least a portion of the second conductive pattern through the second metallization structure.

10. The substrate of claim 1, wherein the first adhesive layer comprises:
a resin material that includes a polymer resin, an epoxy resin, or a combination thereof, or
an adhesive material that is based on the resin material, a non-resin material, or a combination thereof.

11. The substrate of claim 1, wherein the core is a copper clad laminate (CCL) core.

12. A method of manufacturing a substrate, comprising:
forming a first dielectric over a core of the substrate, the core including a core dielectric and a first conductive pattern on a first surface of the core dielectric, the first dielectric being disposed over the first surface of the core dielectric, and the first dielectric being a first portion of a first metallization structure of the substrate over the first surface of the core dielectric;
forming a first opening of the first dielectric, the first opening exposing at least a first portion of the core;
mounting a first electronic component on the core based on a first adhesive layer coupling the first electronic component with the core, the first electronic component being disposed in the first opening of the first dielectric; and forming a second portion of the first metallization structure over the first dielectric and the first electronic component;
wherein a space between a sidewall of the first dielectric and a sidewall of the first electronic component is at least partially filled with the first adhesive layer, and the first adhesive layer touches the sidewall of the first dielectric.

13. The method of claim 12, wherein the mounting the first electronic component on the core comprises:
dispensing a resin material, in an uncured form or a partially cured form, in the first opening on at least the first portion of the core;
placing the first electronic component in the first opening, wherein the dispensed resin material, in the uncured form or the partially cured form, a portion of a gap between the sidewall of the first dielectric and the sidewall of the first electronic component; and
curing the dispensed resin material such that the dispensed resin material, in a cured form, becomes the first adhesive layer.

14. The method of claim 13, wherein the curing the dispensed resin material is performed during a build-up curing process for the forming the second portion of the first metallization structure.

15. The method of claim 13, wherein the dispensed resin material, in the uncured form or the partially cured form, at least partially fills a space between a sidewall of the first opening and a sidewall of the first electronic component.

16. The method of claim 12, wherein the mounting the first electronic component on the core comprises:
placing the first electronic component together with a bonding film in the first opening, the bonding film being used as the first adhesive layer.

17. The method of claim 12, further comprising:
forming a second dielectric under the core of the substrate, the core including a second conductive pattern on a second surface of the core dielectric, the second dielectric being disposed under the second surface of the core dielectric, and the second dielectric being a first portion of a second metallization structure of the substrate under the second surface of the core dielectric;
forming a second opening of the second dielectric, the second opening exposing at least a second portion of the core;
mounting a second electronic component on the core based on a second adhesive layer coupling the second electronic component with the core, the second electronic component being disposed in the second opening of the second dielectric; and
forming a second portion of the second metallization structure under the second dielectric and the second electronic component.

18. The method of claim 12, further comprising:
forming first conductive terminals on an upper surface of the first metallization structure, the first conductive terminals being electrically coupled with at least a portion of the first conductive pattern through the first metallization structure.

19. The method of claim 18, further comprising:
forming a second metallization structure under the core of the substrate, the core including a second conductive pattern on a second surface of the core dielectric, and the second metallization structure being disposed under the second surface of the core dielectric; and forming second conductive terminals on a lower surface of the second metallization structure, the second conductive terminals being electrically coupled with at least a portion of the second conductive pattern through the second metallization structure.

20. The method of claim 12, wherein the first adhesive layer comprises:

a resin material that includes a polymer resin, an epoxy resin, or a combination thereof, or an adhesive material that is based on the resin material, a non-resin material, or a combination thereof.

21. The method of claim 12, wherein the first electronic component includes one or more of active components, one or more passive components, or any combination thereof.

22. An electronic device, comprising:

a substrate that includes:

a core that includes a core dielectric and a first conductive pattern on a first surface of the core dielectric;

a first metallization structure over the first surface of the core dielectric, the first metallization structure including a first dielectric, and the first dielectric having a first opening formed therein;

a first electronic component disposed in the first opening of the first dielectric; and a first adhesive layer coupling the first electronic component with the core;

wherein a space between a sidewall of the first dielectric and a sidewall of the first electronic component is at least partially filled with the first adhesive layer, and the first adhesive layer touches the sidewall of the first dielectric.

23. The electronic device of claim 22, wherein the first electronic component includes one or more of active components, one or more passive components, or any combination thereof.

24. The electronic device of claim 22, wherein:

the substrate further comprises first conductive terminals on an upper surface of the first metallization structure, the first conductive terminals being electrically coupled with at least a portion of the first conductive pattern through the first metallization structure, and the electronic device further comprises an integrated circuit (IC) device mounted on the substrate and electrically coupled with the first conductive terminals.

25. The electronic device of claim 22, wherein:

the core includes a second conductive pattern on a second surface of the core dielectric, and the substrate further comprises:

a second metallization structure under the second surface of the core dielectric, the second metallization structure including a second dielectric, and the second dielectric having a second opening formed therein;

a second electronic component disposed in the second opening of the second dielectric; and a second adhesive layer coupling the second electronic component with the core.

26. The electronic device of claim 22, wherein the first adhesive layer comprises:

a resin material that includes a polymer resin, an epoxy resin, or a combination thereof, or an adhesive material that is based on the resin material, a non-resin material, or a combination thereof.

27. The electronic device of claim 22, wherein the electronic device comprises at least one of: a music player; a video player; an entertainment unit; a navigation device; a communications device; a mobile device; a mobile phone; a smartphone; a personal digital assistant; a fixed location terminal; a tablet computer, a computer; a wearable device; a laptop computer; a server; an internet of things (IoT) device; or a device in an automotive vehicle.

\* \* \* \* \*